United States Patent
Kabumoto et al.

(10) Patent No.: US 6,707,685 B2
(45) Date of Patent: Mar. 16, 2004

(54) MULTI-LAYER WIRING BOARD

(75) Inventors: Masanao Kabumoto, Kokubu (JP); Kouki Kawabata, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/132,685

(22) Filed: Apr. 25, 2002

(65) Prior Publication Data

US 2002/0181185 A1 Dec. 5, 2002

(30) Foreign Application Priority Data

Apr. 26, 2001 (JP) .................................. P2001-129807

(51) Int. Cl.⁷ .............................. H05K 7/06; H03H 7/01
(52) U.S. Cl. ...................... 361/794; 361/763; 361/780; 361/793; 333/12; 333/175; 333/176; 333/185; 333/247; 257/691; 257/700
(58) Field of Search ................................ 361/734, 738, 361/760, 763, 777, 778, 780, 782, 783, 792–795, 805, 806, 818; 333/12, 175–6, 182, 185, 246, 247; 257/664, 691, 700, 723, 724, 728; 174/255, 260–262

(56) References Cited

U.S. PATENT DOCUMENTS 5,422,782 A * 6/1995 Hernandez et al. ...... 361/306.2
5,736,913 A * 4/1998 Sanyigo et al. ............. 333/246
5,912,809 A * 6/1999 Steigerwald et al. ........ 361/780
6,418,031 B1 * 7/2002 Archambeault ............. 361/762
6,473,312 B1 * 10/2002 Hiratsuka et al. ........... 361/794
6,525,945 B1 * 2/2003 Louis et al. ................. 361/763

FOREIGN PATENT DOCUMENTS

| JP | 5-267540 | 10/1993 |
|----|----------|---------|
| JP | 5-275863 | 10/1993 |
| JP | 6-204638 | 7/1994 |
| JP | 9-008633 | 1/1997 |

* cited by examiner

Primary Examiner—John B. Vigushin
(74) Attorney, Agent, or Firm—Hogan & Hartson

(57) ABSTRACT

A multi-layer wiring board comprises an insulating substrate having, on a central part of its top surface, a semiconductor device mounting portion and having, on its under surface, an external electrode. The insulating substrate includes a multilayered wiring having a first group of parallel wiring lines; a second group of parallel wiring lines arranged orthogonal thereto; and a group of through conductors for providing electrical connection therebetween. Power is supplied from the external electrode to the semiconductor device through built-in capacitors formed therewithin. The built-in capacitors are connected in parallel that have different resonance frequencies within a range from an operating frequency band for the semiconductor device to a frequency band for a harmonic component, and at an anti-resonance frequency occurring between the different resonance frequencies, a composite impedance is equal to or below a predetermined value.

15 Claims, 13 Drawing Sheets

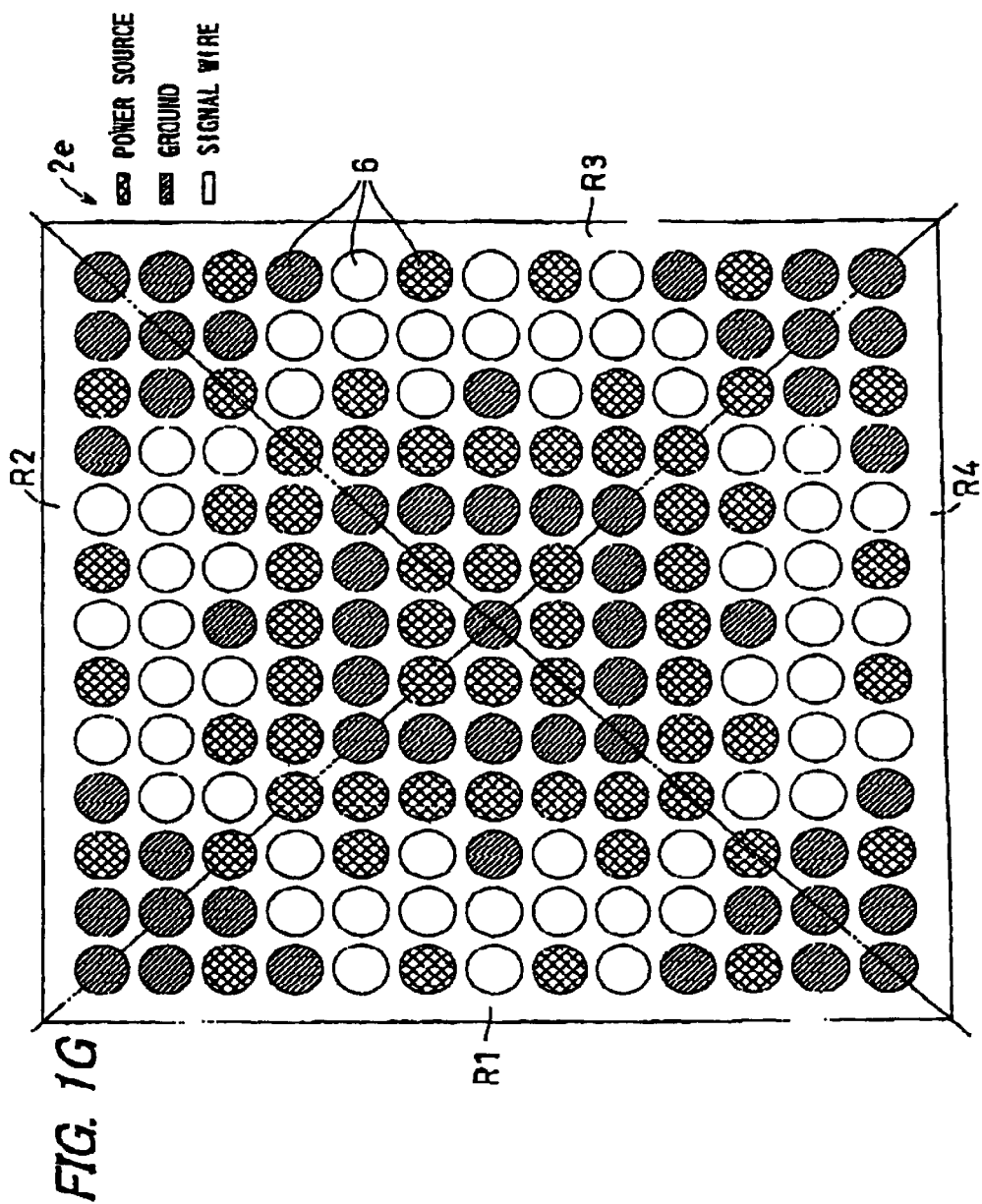

MULTI-LAYER WIRING BOARD

BACKGROUND OF THE INVENTION

1. Field of the Invention

The present invention relates to a multi-layer wiring board used for an electronic circuit board on which a semiconductor device housing package for housing therein a semiconductor device, a semiconductor device, an electronic component, or the like are mounted, and more particularly to a multi-layer wiring board having a wiring structure suitable for housing or mounting a semiconductor device which is operated at high speed.

2. Description of the Related Art

A multi-layer wiring board, on which electronic components including a semiconductor device such as a microprocessor, an ASIC (Application Specific Integrated Circuit), or a semiconductor integrated circuit device are mounted, is commonly used for an electronic circuit board or the like. Hitherto, in constituting a wiring conductor for usage in internal wiring, a multi-layer wiring board is formed by alternately stacking one on top of another insulating layers made of ceramics such as alumina, and wiring conductors made of metal having a high melting point such as tungsten (W).

In keeping with an increasing demand for improvements in data processing capability, a semiconductor device has come to be operated at higher and higher speed. As a result, out of wiring conductors for internal wiring, a signal wiring line is required to offer improved electric properties in terms of characteristic impedance matching, reduction in cross-talk noise between signal wiring lines, or other. In a conventional multi-layer wiring board, out of wiring conductors for internal wiring, a signal wiring commonly takes on a strip wiring structure. That is, a wiring conductor formed as a signal wiring line has, in its upper and lower parts, a wider-area ground layer or power source layer of so-called solid-pattern configuration formed via an insulating layer.

However, such a multi-layer wiring board as stated above has the following disadvantage. Since the insulating layer is made of alumina ceramics or the like having a relative dielectric constant of ca. 10, an electromagnetic coupling between the signal wiring lines becomes unduly great, resulting in an undesirable increase in cross-talk noise. This makes it impossible to handle increasingly higher operational speed of a semiconductor device.

In order to deal with higher-speed electric signals, attempts have been made to obtain a high-density, high-performance multi-layer wiring board capable of operating a semiconductor device at higher speed. For example, such a multi-layer wiring board is constructed as follows. An insulating layer is formed by using polyimide resin or epoxy resin having a relatively low relative dielectric constant in a range from 3.5 to 5, instead of alumina ceramics having a relative dielectric constant of ca. 10. On this insulating layer is formed an internal wiring conductor layer made of copper (Cu) by a thin-film forming technique based on a vapor-deposition method, such as an evaporation method or a sputtering method. Then, by using photolithography, a wiring conductor of fine pattern is formed, and the insulating layer and the wiring conductor are stacked in layers.

In order to reduce ringing noise by achieving wiring impedance matching, to reduce cross talk between signal wiring lines, and to realize high-density wiring, as an internal wiring structure designed for a multi-layer wiring board, such a structure is proposed that groups of parallel wiring lines are formed on the top surface of each insulating layer and they are stacked in layers, and, out of the wiring lines included in the layered wiring groups, specified ones are electrically connected to each other via a through conductor such as a via conductor or a through hole conductor.

In a multi-layer wiring board having such a parallel wiring group, to provide electrical connection between an electronic component, such as a semiconductor device, to be mounted on the multi-layer wiring board and amounting board for mounting thereon the multi-layer wiring board, with in the multi-layer wiring board, out of the wiring lines included in the groups of parallel wiring lines, suitable ones are selected. The selected wiring lines lying in different wiring layers are connected to each other via a through conductor such as a via conductor.

According to the multi-layer wiring board described above, as compared with the case where the signal wiring takes on a strip line structure, the number of the wiring layers can be reduced. Besides, inside the groups of parallel wiring lines, as well as in a region between the groups of parallel wiring lines, cross talk between the signal wiring lines can be reduced.

Moreover, one problem involved in power source supply for a semiconductor device is occurrence of simultaneous switching noise. Specifically, since a power-source voltage required for switching of the semiconductor device is supplied from the outside of the multi-layer wiring board through the power source wiring and ground wiring, when a plurality of signal wiring lines are concurrently subjected to the switching operation of the semiconductor device, noise is produced between the power source wiring and the ground wiring due to the inductance components included in the power source wiring or the ground wiring.

To overcome the above-stated problems, there has been adopted a method of incorporating within the multi-layer wiring board a capacitor composed of a wider-area power source wiring layer and a ground wiring layer, which are arranged so as to oppose each other via an insulating layer provided therebetween. By arranging the wider-area power source wiring layer and/or ground wiring layer in that way, it is possible to incorporate within the multi-layer wiring board a capacitor having a capacitance value as great as several nF. Consequently, the impedance value for the built-in capacitor is reduced, whereby making it possible to reduce the simultaneous switching noise. Note that the impedance value is proportional to the square root of the inductance value but is inversely proportional to the square root of the capacitance value. It has been known that, in general, the smaller the impedance value for the built-in capacitor, the less the simultaneous switching noise. Further, to obtain as large a capacitance value as possible, an attempt has been made to form a plurality of capacitors within the multi-layer wiring board.

However, the above-described multi-layer wiring board, provided with the groups of parallel wiring lines arranged orthogonally with respect to each other, also encounters a problem of EMI (Electro Magnetic Interference) noise, as the result that an electronic component, such as a semiconductor device, to be mounted thereon has come to be operated at higher and higher speed. The EMI noise mentioned just above may be explained as follows. If electronic equipment of various types emit an unnecessary electromagnetic wave, the electromagnetic wave finds its way into the electronic equipment or other peripheral electronic equipment, so that it becomes noise and exerts an adverse effect on the electric circuits. This brings the electronic equipment into malfunction.

Besides, as further improvement has been eagerly sought in data processing capability, the operational speed of a semiconductor device has been rapidly increased and, for example, a semiconductor device has come to be operated at a frequency of greater than 1 GHz. As a natural consequence of this trend, another problem arises that unduly large simultaneous switching noise is caused by a harmonic component included in an electric signal which is transmitted to the interior of the multi-layer wiring board.

The harmonic component refers to a frequency component having a relatively high frequency included in a digital signal. The harmonic component is increased in component proportion at a frequency which is equivalent to an integral multiple of the operating frequency (fundamental wave) of the semiconductor device, but is decreased in component proportion as its frequency becomes higher and higher. It has been known that in particular a harmonic component having a frequency up to ca. 5 times higher than the operating frequency is largish in component proportion. In light of this fact, the impedance value needs to be reduced also at a band of frequencies which are ca. 5 times higher than the operating frequency.

Hereupon, in the above-described conventional multi-layer wiring board incorporating a capacitor composed of a wider-area power source wiring layer and/or ground wiring layer that are arranged so as to oppose each other via an insulating layer disposed therebetween, because of its structure in which the built-in capacitor having a specific capacitance value is formed, the impedance value can be reduced at the frequency band close to the operating frequency by setting the resonance frequency, included in the impedance characteristics of the built-in capacitor, to be close to the operating frequency of the semiconductor device. However, in this construction, no consideration is given to the impedance value at the frequency band of the harmonic component. Therefore, in the region in which the operating frequency of the semiconductor device is low, the simultaneous switching noise can be reduced successfully, whereas in the high-frequency region in which the operating frequency exceeds several GHz, the impedance value for the built-in capacitor becomes unduly large and accordingly the simultaneous switching noise is increased.

Moreover, in a case where the anti-resonance frequency included in the impedance characteristics of the built-in capacitor coincides with the frequency of the harmonic component, the harmonic component acts as electromagnetic noise on the power source wiring and the ground wiring, resulting in an undesirable increase in the EMI noise.

SUMMARY OF THE INVENTION

The invention has been devised to solve the above-described problems, and accordingly its object is to provide a multi-layer wiring board suitable for an electronic circuit board on which an electronic component operating at high speed such as a semiconductor device is mounted, which is characterized in that: groups of parallel wiring lines are orthogonally stacked on top of each other; cross-talk noise occurring between adjacent wiring lines can be reduced without sacrificing the electric properties; and simultaneous switching noise, as well as EMI noise, can be reduced successfully.

The invention provides a multi-layer wiring board comprising:

an insulating substrate including a first insulating layer and a second insulating layer stacked on the first insulating layer, the insulating substrate having, on a central part of a top surface thereof, a semiconductor device mounting portion with a semiconductor device connecting electrode attached thereto, and having, on an under surface thereof, an external electrode for supplying electric power to the semiconductor device;

a multilayered wiring including a first group of parallel wiring lines formed on the first insulating layer, the parallel wiring lines, in each of divided sections that are obtained by dividing the multi-layer wiring board into several sections by two to four straight lines intersecting at a center of the first insulating layer in such a way that central angles of the divided sections are made substantially equal to each other, being so formed as to extend toward the intersection, a second group of parallel wiring lines formed on the second insulating layer, the parallel wiring lines, in each of the divided sections, being respectively arranged orthogonally with respect to the parallel wiring lines constituting the first group of parallel wiring lines, and a group of through conductors for providing electrical connection between the first and second groups of parallel wiring lines, and built-in capacitors provided in an interior of the insulating substrate, the built-in capacitors having a power source wiring layer and a ground wiring layer which are arranged to oppose each other via an insulating layer disposed therebetween, wherein electric power is supplied from the external electrode to the semiconductor device through the built-in capacitors, and wherein the built-in capacitors have mutually different resonance frequencies within a range from an operating frequency band for the semiconductor device to a frequency band for a harmonic component, are connected in parallel with each other, and at an anti-resonance frequency occurring between the different resonance frequencies, a composite impedance is set to be equal to or less than a predetermined value.

According to the invention, the multi-layer wiring structure, in which the groups of parallel wiring lines are orthogonally stacked on top of each other, includes a multilayered wiring constructed as follows. The structure is divided into several sections by two to four straight line intersecting at the center of the first insulating layer, with the central angles of the sections made substantially equal to each other. In each of the divided sections, the first and second groups of parallel wiring lines are provided. The first group of parallel wiring lines is composed of a plurality of parallel wiring lines that are disposed so as to extend substantially parallelly in a direction toward the intersection, i.e. the central part of the first insulating layer, and the second group of parallel wiring lines is composed of a plurality of parallel wiring lines that are disposed so as to extend substantially parallelly in a direction orthogonal to the group of parallel wiring lines of the first wiring layer. The first and second groups of parallel wiring lines are electrically connected to each other by the through conductor group. In this structure, the wiring lines constituting the second group of parallel wiring lines are arranged substantially circumferentially about the center of the second insulating layer. This substantially circular wiring structure yields the effect of preventing external intrusion of EMI noise and the effect of shielding against external radiation of unnecessary electromagnetic noise. Hence, the multi-layer wiring board embodying the invention succeeds in minimizing the cross-talk noise occurring between the wiring lines without sacrificing the electric properties of the groups of parallel wiring lines, and also succeeds in achieving effective EMI control.

Moreover, the divided sections are defined by two to four straight lines intersecting at the center of the first insulating layer, with their central angles made substantially equal to each other. Consequently, the wiring flexibility can be enhanced and thus the wiring length can be shortened, so that the resistance, inductance, and capacitance can be minimized.

According to the invention, inside the insulating substrate is provided built-in capacitors for supplying electric power which have a power source wiring layer and a ground wiring layer arranged to oppose each other via an insulating layer disposed therebetween. The built-in capacitors are connected in parallel with each other that have different resonance frequencies within a range from the operating frequency band for the semiconductor device to the frequency band for the harmonic component. In this structure, the resonance frequency, at which the impedance value is kept at a minimum, can be so set as to vary in the individual built-in capacitors within the range from the operating frequency band for the semiconductor device to the frequency band of the harmonic component. Further, the composite impedance at the anti-resonance frequency occurring between the different resonance frequencies is set to be equal to or less than a predetermined value. Consequently, in the range from the operating frequency band for the semiconductor device to the frequency band of the harmonic component, the composite impedance value can be minimized over a wider frequency band.

In the invention, it is preferable that the composite impedance value at the anti-resonance frequency is set to be 1 Ω or below.

According to the invention, by setting the composite impedance value at the anti-resonance frequency to be 1 Ω or below, the inductance components included in the power source wiring layer and the ground wiring layer can be minimized. Consequently, the simultaneous switching noise can be reduced at the high-frequency band where the semiconductor device is operated at a frequency greater than several GHz, as well as at the frequency band of the harmonic component.

Moreover, since the power source wiring layer and the ground wiring layer are made to have a wider area, it is possible to form a built-in capacitor having a capacitance value as large as several nF. Consequently, the simultaneous switching noise can be reduced also at the low-frequency band where the semiconductor device is operated at a frequency as low as several MHz.

Further, the anti-resonance frequency, included in the impedance characteristics of the built-in capacitor, can be set at a value incoincident with the frequency of the harmonic component included in an electric signal, by controlling the capacitance values for the built-in capacitors. This makes it possible to reduce the EMI noise.

In the invention, it is preferable that the first and second groups of parallel wiring lines each include a plurality of signal wiring lines and power source wiring lines or ground wiring lines arranged adjacent to the signal wiring lines.

According to the invention, the first and second groups of parallel wiring lines each include a plurality of signal wiring lines and power source wiring lines or ground wiring lines arranged adjacent to the signal wiring lines. In this structure, the signal wiring lines disposed on the same insulating layer are electromagnetically cut off from each other, and thereby the cross-talk noise occurring between the signal wiring lines arranged side by side on the same plane can be reduced successfully. Further, by arranging the power source wiring line or the ground wiring line adjacent to the signal wiring line without fail, the interaction between the signal wiring line and the power source wiring line or the ground wiring line, arranged on the same plane, can be maximized, thereby decreasing the inductance of the power source wiring line and the ground wiring line. Reduction in the inductance makes possible effective reduction in power source noise and ground noise.

In the invention, it is preferable that the second group of parallel wiring lines includes a circular wiring which is constituted by connecting the wiring lines lying in the individual divided sections.

According to the invention, the second group of parallel wiring lines includes a circular wiring constituted by connecting the wiring lines lying in the individual divided sections. By providing such a circular wiring, it is possible to cope with EMI noise effectively, thereby achieving more effective EMI control.

In the invention, it is preferable that an outermost circular wiring of the second group of parallel wiring lines is a ground wiring.

According to the invention, the second group of parallel wiring lines has its outermost circular wiring made as a ground wiring. This circular ground wiring brings about remarkable EMI-noise shielding effect, whereby making it possible to achieve far more effective EMI control.

In the invention, it is preferable that the built-in capacitors are made different from each other in resonance frequency by varying the sizes of the oppositely-arranged power source wiring layers and ground wiring layers of the built-in capacitors.

In the invention, it is preferable that the built-in capacitors are made different from each other in resonance frequency by varying dielectric constants of the insulating layers lying between the oppositely-arranged power source wiring layers and ground wiring layers.

In the invention, it is preferable that the built-in capacitors are so designed that the anti-resonance frequency associated with impedance characteristics is set at a value incoincident with the operating frequency of the semiconductor device.

In the invention, it is preferable that, out of the built-in capacitors, the one arranged closer to the semiconductor device mounting portion is made higher in resonance frequency.

In the invention, it is preferable that the power source wiring layers and the ground wiring layers, constituting the built-in capacitors, are formed on layers other than that on which the first and second groups of parallel wiring lines are formed.

According to the invention, there is realized a multi-layer wiring board suitable for an electronic circuit board or the like on which an electronic component operating at higher speed, such as a semiconductor device, is mounted. The multi-layer wiring board is provided with groups of parallel wiring lines which are orthogonally stacked on top of each other, and thus succeeds in minimizing cross-talk noise occurring between adjacent wiring lines without sacrificing the electric properties, and also succeeds in minimizing simultaneous switching noise as well as EMI noise.

The invention further provides a multi-layer wiring board comprising:

an insulating substrate constituted by stacking a plurality of insulating layers on top of each other, the insulating substrate having, on a top surface thereof, a semiconductor device connecting electrode, and having, on an under surface thereof, an external electrode for supplying electric power to the semiconductor device; and built-in capacitors provided in an interior of the insulating substrate, the built-in capacitors having a power source wiring layer and a ground wiring layer which are arranged to oppose each other via the insulating layer disposed therebetween, wherein electric power is supplied from the external electrode to the semiconductor device through the built-in capacitors, and wherein the built-in capacitors have mutually different resonance frequencies within a range from an operating frequency band for the semiconductor device to a frequency band for a harmonic component, are connected in parallel with each other, and at an anti-resonance frequency occurring between the different resonance frequencies, a composite impedance is set to be equal to or less than a predetermined value.

According to the invention, inside the insulating substrate is provided built-in capacitors for supplying electric power having a power source wiring layer and a ground wiring layer arranged to oppose each other via an insulating layer disposed therebetween. The built-in capacitors are connected in parallel with each other that have different resonance frequencies within a range from the operating frequency band for the semiconductor device to the frequency band for the harmonic component. In this structure, the resonance frequency, at which the impedance value is kept at a minimum, can be so set as to vary in the individual built-in capacitors within the range from the operating frequency band for the semiconductor device to the frequency band of the harmonic component. Further, the composite impedance at the anti-resonance frequency occurring between the different resonance frequencies is set to be equal to or less than a predetermined value. Consequently, in the range from the operating frequency band for the semiconductor device to the frequency band of the harmonic component, the composite impedance value can be minimized over a wider frequency band.

According to the invention, there is provided a multi-layer wiring board suitable for an electronic circuit board or the like on which an electronic component operating at higher speed such as a semiconductor device is mounted, in which simultaneous switching noise and EMI noise can be reduced successfully.

BRIEF DESCRIPTION OF THE DRAWINGS

Other and further objects, features, and advantages of the invention will be more explicit from the following detailed description taken with reference to the drawings wherein:

FIG. 1A is a sectional view showing a multi-layer wiring board according to a first embodiment of the invention and FIGS. 1B to 1G are plan views showing the wiring pattern as observed in each of the insulating layers of the multi-layer wiring board;

DETAILED DESCRIPTION OF THE PREFERRED EMBODIMENTS

Figure 1A:
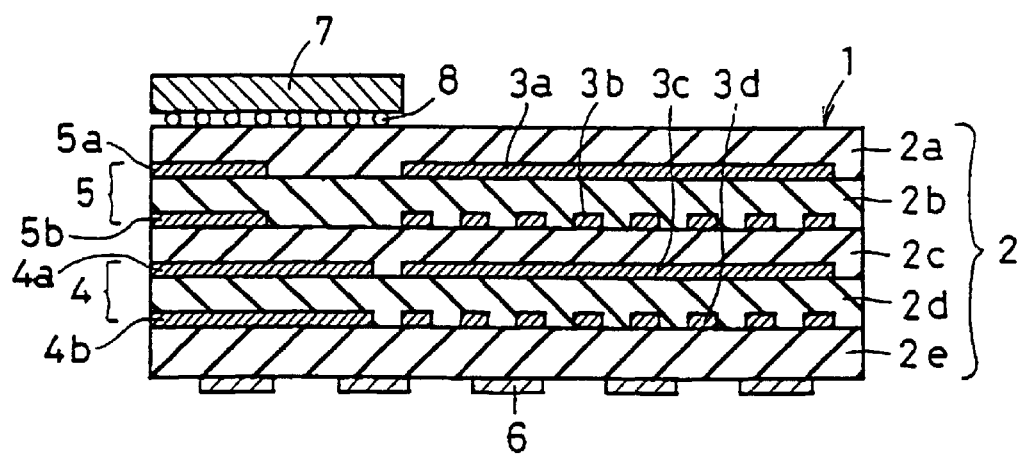

Now referring to the drawings, preferred embodiments of the invention are described below.

FIG. 1A is a sectional view showing a multi-layer wiring board according to a first embodiment of the invention. FIGS. 1B to 1G are plan views showing the wiring pattern as observed in each of the insulating layers of the multi-layer wiring board. Note that FIG. 1A illustrates only one of the divided sections which will be described later, and FIG. 1G is a view showing the reverse side of the surface shown in FIG. 1F. Moreover, in FIG. 1A, the through conductors are not depicted for the sake of simplicity. In FIG. 1A, reference numeral 1 represents the multi-layer wiring board, and 2 represents an insulating substrate. The insulating substrate 2 is constituted by stacking on top of each other a plurality of insulating layers 2a to 2e as shown in FIGS. 1B to 1G. In the multi-layer wiring board 1 of this embodiment, the insulating layers 2a to 2e are made of insulating materials that are basically identical with each other in relative dielectric constant. Here, the insulating layer 2b, 2d shown in FIGS. 1C and 1E corresponds to a first insulating layer. The first insulating layer has its top surface divided into several sections by two to four straight lines intersecting at the center thereof, with the central angles of the sections made substantially equal to each other. On each of the divided sections R1 to R4 is formed a first group of parallel wiring lines 3a, 3c composed of a plurality of parallel wiring lines extending toward the intersection. Meanwhile, the insulating layer 2c, 2e shown in FIGS. 1D and 1F corresponds to a second insulating layer. The second insulating layer has it stop surface divided into several sections. On each of the divided sections R1 to R4 is formed a second group of parallel wiring lines 3b, 3d composed of a plurality of parallel wiring lines which are respectively arranged orthogonal to the parallel wiring lines constituting the first group of the parallel wiring lines 3a, 3c. The first group of parallel wiring lines 3a, 3c and the second group of parallel wiring lines 3b, 3d are electrically connected to each other at the intersection of the upper and lower wiring lines, by a group of through conductors 9, as required. As a result, desired paths for the signal wiring lines 3a1, 3b1, 3c1, 3d1, the power source wiring lines 3a2, 3b2, 3c2, 3d2, and the ground wiring lines 3a3, 3b3, 3c3, 3d3 are formed, thereby constituting a multilayered wiring.

Note that a plurality of the signal wiring lines 3a1, 3b1, 3c1, 3d1, included in the groups of parallel wiring lines 3a to 3d, may be so designed as to transmit mutually different electric signals, and a plurality of the power source wiring lines may be so designed as to supply mutually different electric powers.

Figure 1B:
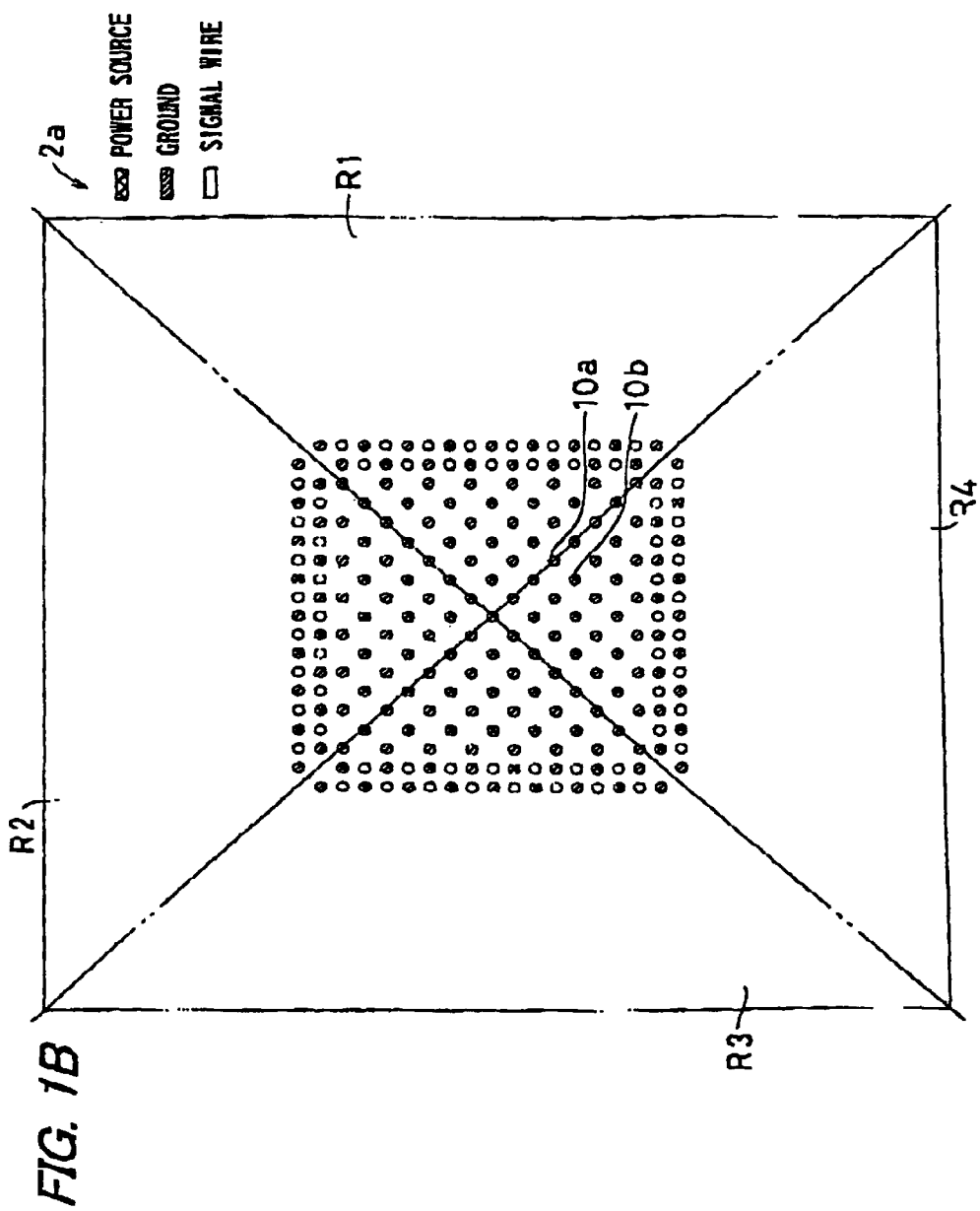
Figure 1C:
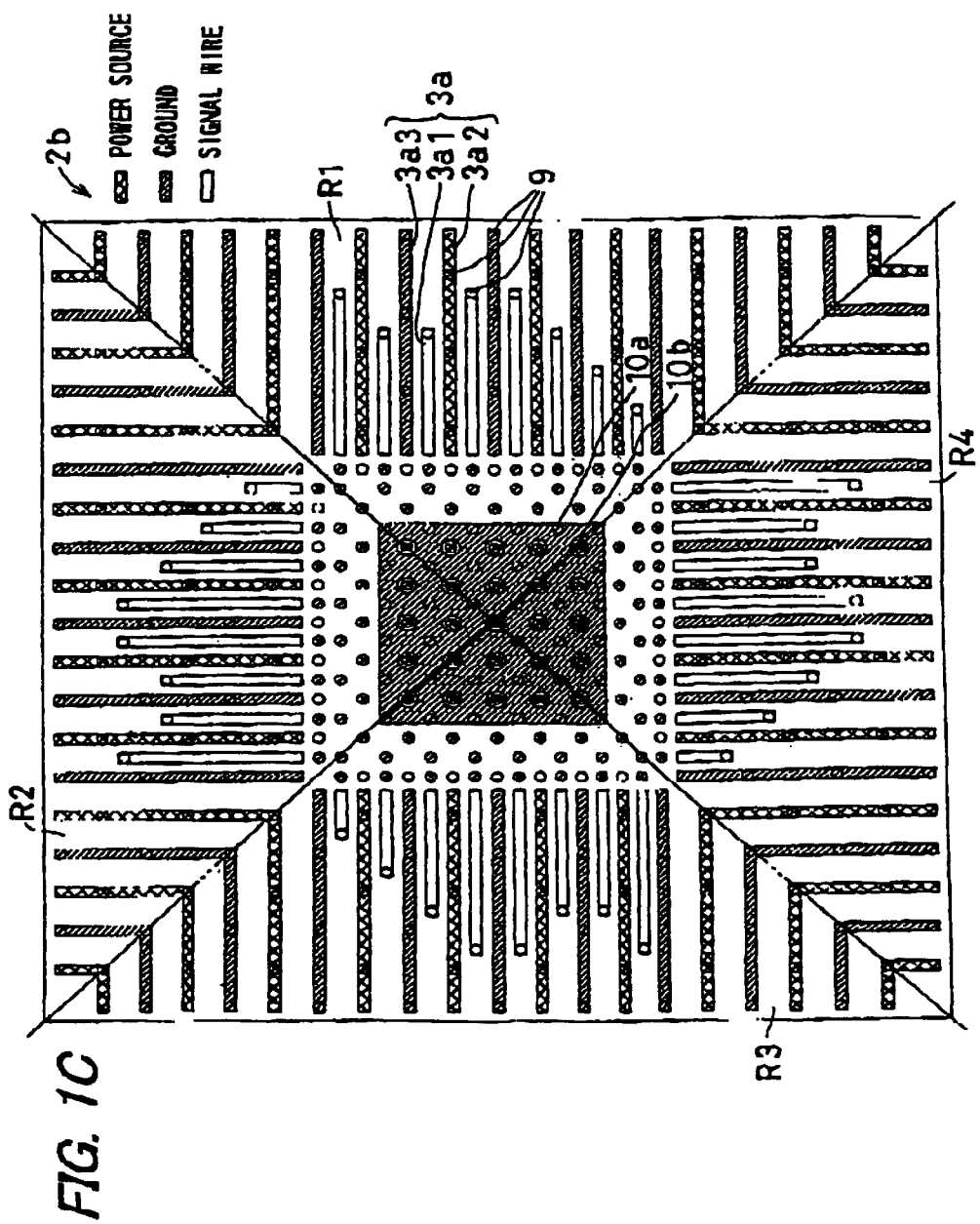
Figure 1D:
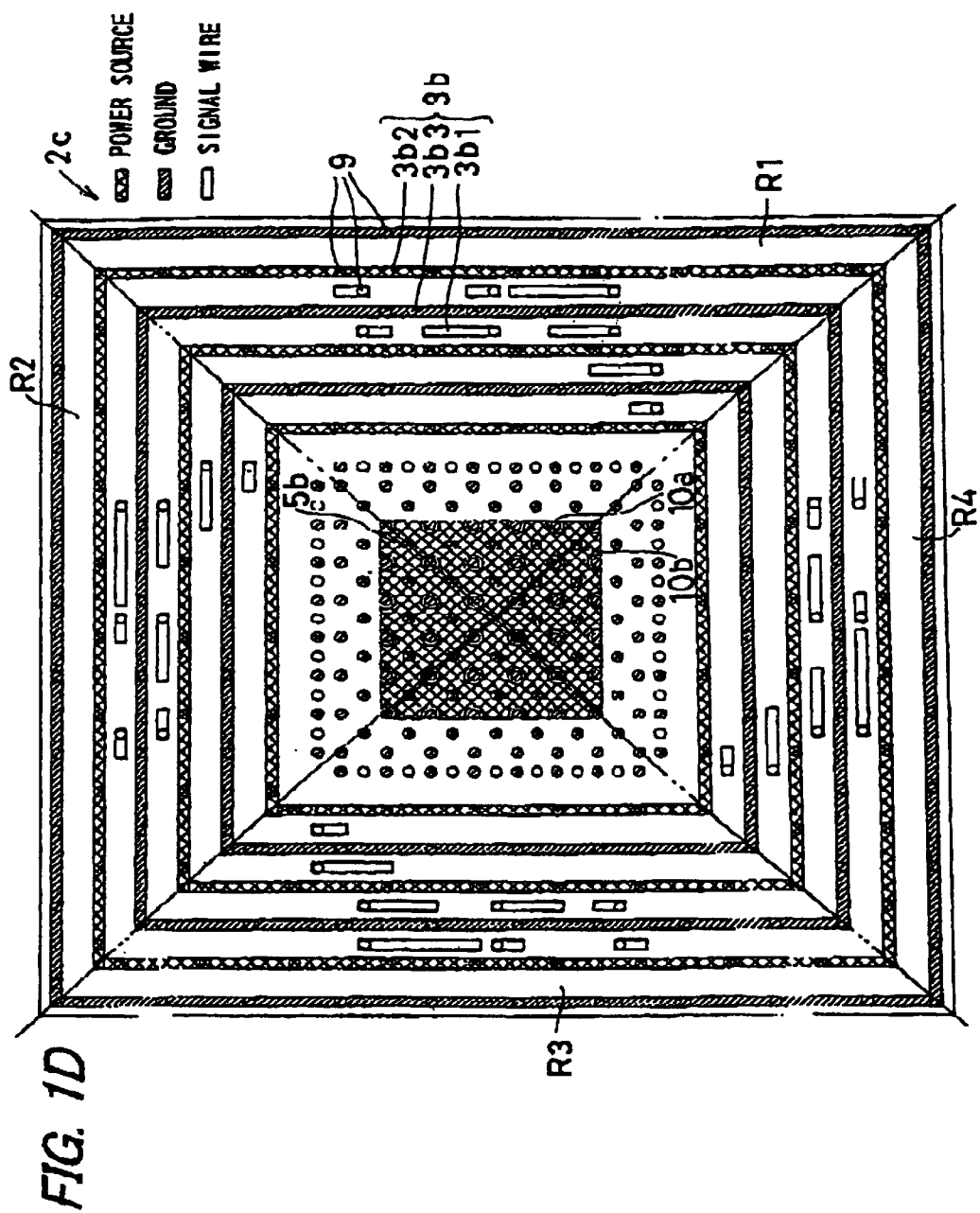
Figure 1E:
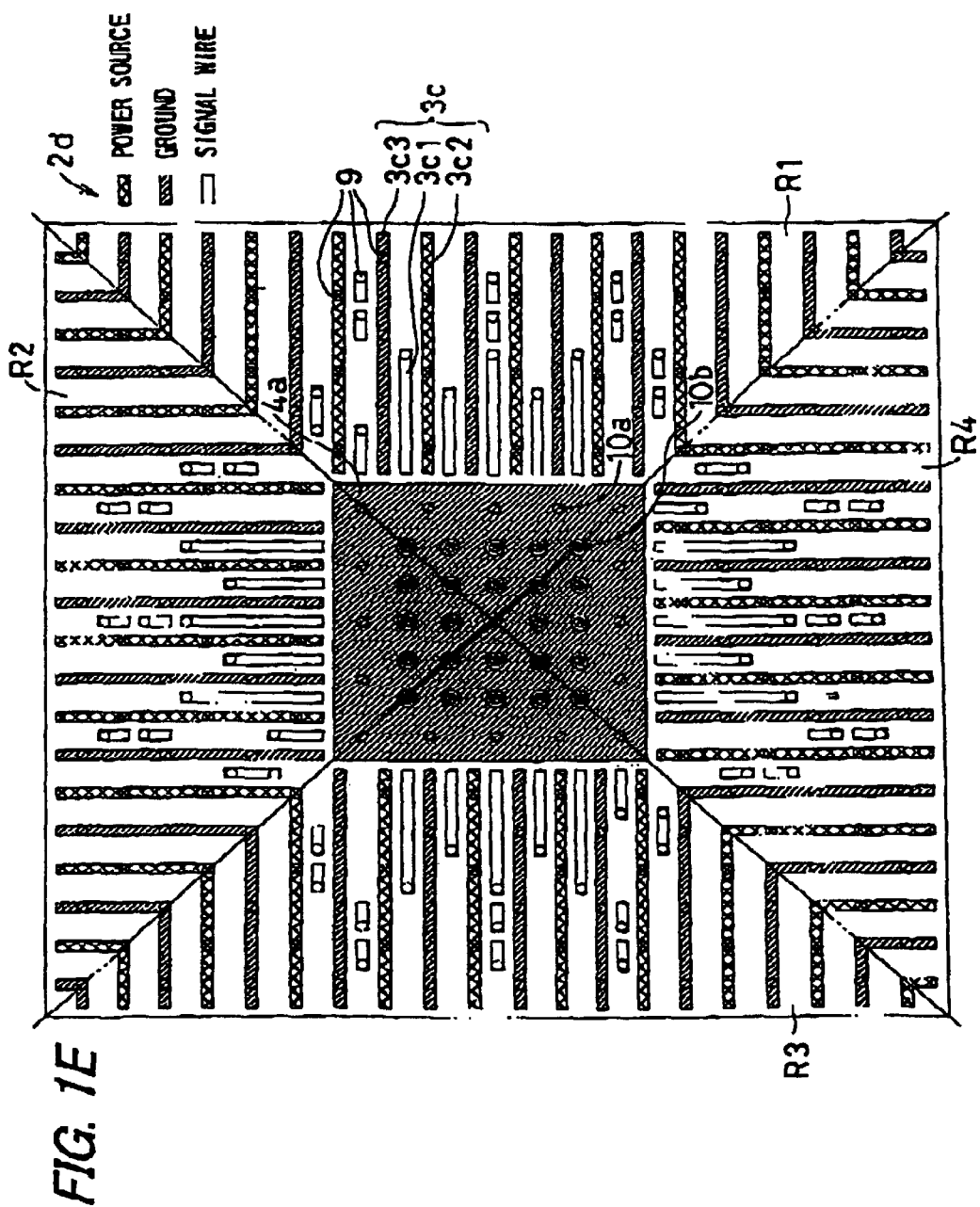

As shown in FIGS. 1C and 1E, for example, the first insulating layer 2b, 2d has its top surface divided into four sections by two straight lines intersecting at the center thereof, with the central angles of the sections made substantially equally to be ca. 90 degrees. On each of the divided sections R1 to R4 is disposed the first group of parallel wiring lines 3a, 3c composed of a plurality of parallel wiring lines extending toward the intersection, i.e. the central part of the first insulating layer 2b, 2d. Alternatively, the construction may be divided into six sections by three straight lines intersecting at the center thereof, with the central angles of the sections made to be ca. 60 degrees, or divided into eight sections by four straight lines intersecting at the center thereof, with the central angles of the sections made to be ca. 45 degrees. In either case, it is possible to realize a multilayered wiring which is excellent in electric properties.

Figure 1F:
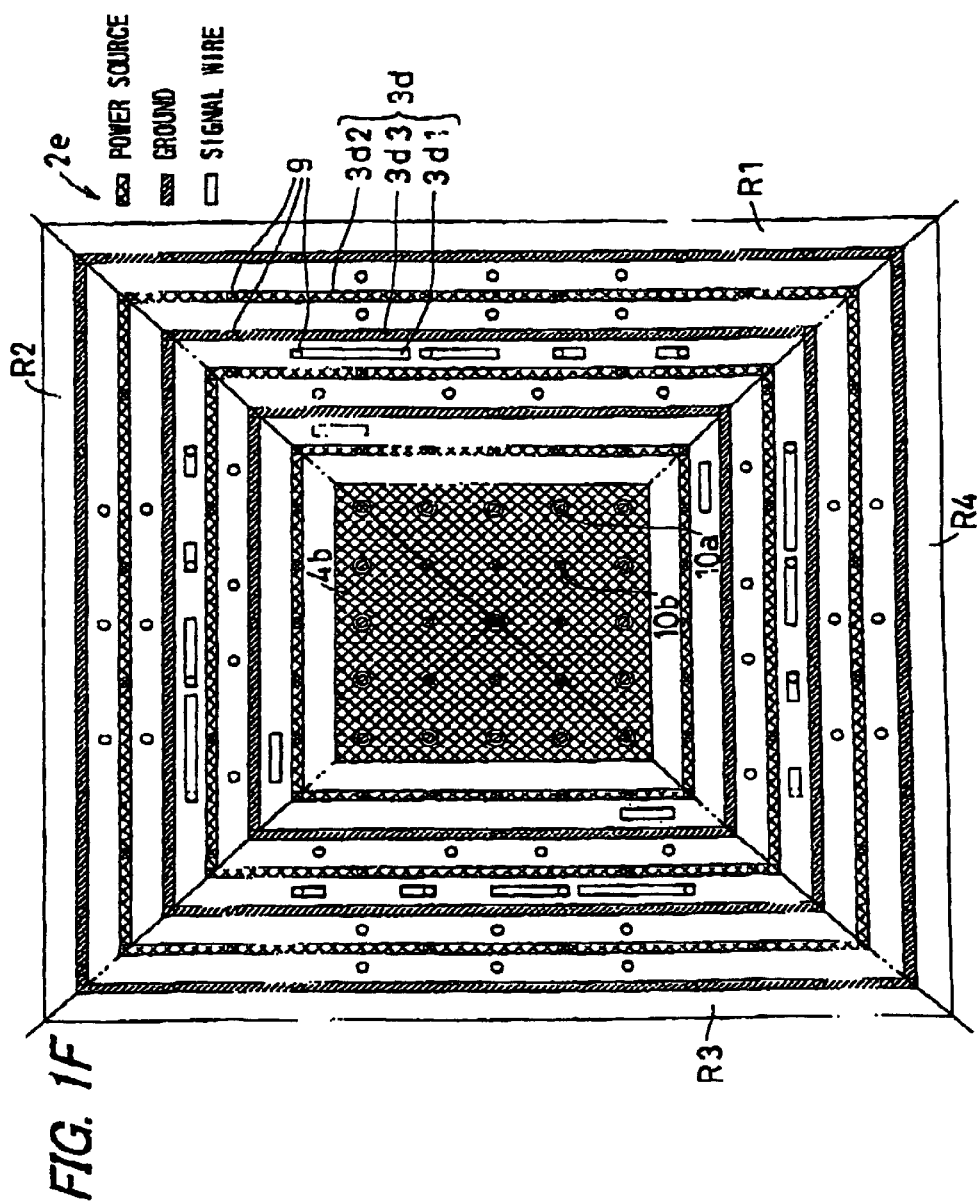

Moreover, as shown in FIGS. 1D and 1F, the second insulating layer 2c, 2e has its top surface divided into several sections, and on each of the divided sections R1 to R4 is formed the second group of parallel wiring lines 3b, 3d composed of a plurality of parallel wiring lines that are so disposed as to be orthogonal to the parallel wiring lines constituting the first group of parallel wiring lines 3a, 3c. In addition, the second group of parallel wiring lines 3b, 3d may take on, for example, a substantially square-shaped circular wiring structure composed of wiring lines parallel to each side of the substantially square-shaped insulating layer 2c, 2e. This structure is obtained by connecting together the wiring lines disposed in the individual divided sections R1 to R4.

The first group of parallel wiring lines 3a, 3c and the second group of parallel wiring lines 3b, 3d are electrically connected, at their corresponding wiring lines, to each other at desired positions, by a group of through conductors 9 formed in the first insulating layer 2b, 2d. Thereby, a multilayered wiring is constituted in which groups of parallel wiring lines are arranged orthogonally on the divided sections basis.

Moreover, in this embodiment, the first and second groups of parallel wiring lines 3a to 3d should preferably be disposed in such a way that the power source wiring line 3a2, 3b2, 3c2, 3d2, or the ground wiring line 3a3, 3b3, 3c3, 3d3 is arranged adjacent to the signal wiring line 3a1, 3b1, 3c1, 3d1. In this arrangement, the signal wiring lines 3a1, 3b1, 3c1, 3d1 disposed on the same insulating layer (2a to 2d) are electro magnetically cut off from each other, whereby making it possible to successfully reduce the cross-talk noise occurring between the signal wiring lines 3a1, 3b1, 3c1, 3d1 arranged side by side on the same plane. Further, by arranging the power source wiring line 3a2, 3b2, 3c2, 3d2 or the ground wiring line 3a3, 3b3, 3c3, 3d3 adjacent to the signal wiring line 3a1, 3b1, 3c1, 3d1 without fail, the interaction between the signal wiring line 3a1, 3b1, 3c1, 3d1 and the power source wiring line 3a2, 3b2, 3c2, 3d2 or the ground wiring line 3a3, 3b3, 3c3, 3d3, arranged on the same plane, can be maximized, thereby decreasing the inductance of the power source wiring line 3a2, 3b2, 3c2, 3d2 and the ground wiring line 3a3, 3b3, 3c3, 3d3. Reduction in the inductance makes possible effective reduction in power source noise and ground noise.

According to the invention, as described above, the multilayer wiring board 1 is provided with the multilayered wiring in which divided sections R1 to R4 are provided, and the groups of parallel wiring lines 3a to 3d are formed so as to be orthogonal to each other in the individual divided sections R1 to R4. In this construction, the wiring lines constituting the second group of parallel wiring lines 3b, 3d are arranged circumferentially about the central part of the second insulating layer 2c, 2e. The substantially circular wiring structure thus obtained brings about the effect of preventing external intrusion of EMI noise and the shielding effect against external radiation of unnecessary electromagnetic noise, whereby making it possible to reduce the cross-talk noise occurring between the wiring lines and to achieve EMI control effectively.

Moreover, the second group of parallel wiring lines 3b, 3d should preferably include a circular wiring which is constituted by connecting the wiring lines disposed in the individual divided sections. Providing such a circular wiring makes it possible to cope with EMI noise effectively, thereby achieving more effective EMI control.

Further, the second group of parallel wiring lines 3b, 3d should preferably have its outermost circular wiring made as a ground wiring. This circular ground wiring brings about remarkable EMI-noise shielding effect, whereby making it possible to achieve far more effective EMI control.

Incidentally, numeral symbols 4a, 4b and 5a, 5b respectively represent a wider-area power source wiring layer and/or ground wiring layer formed inside the insulating substrate 2. In this embodiment, by way of the power source wiring layer and/or the ground wiring layer 4a, 4b and 5a, 5b, two built-in capacitors, i.e. a first built-in capacitor 4 and a second built-in capacitor 5, are formed within the multi-layer wiring board 1. The built-in capacitors 4 and 5 are connected in parallel with each other by a through conductor 10a, 10b, or the like.

Hereupon, the arrangement of the power source wiring layer and/or the ground wiring layer 4a, 4b and 5a, 5b is made in such a way that the layers of different functions are alternately stacked on top of each other. That is, on the one hand, if 4a and 5a are defined as the power source wiring layer, 4b and 5b are defined as the ground wiring layer, and on the other hand, if 4a and 5a are defined as the ground wiring layer, 4b and 5b are defined as the power source wiring layer.

In this embodiment, the electrode (the power source wiring layer or ground wiring layer) 5a, 5b of the second built-in capacitor 5 is made smaller in size than the electrode (the power source wiring layer or ground wiring layer) 4a, 4b of the first built-in capacitor 4. By so doing, the second built-in capacitor 5 is made smaller in capacitance, so that the first and second built-in capacitors have mutually different resonance frequencies.

Moreover, in the multi-layer wiring board 1, the insulating substrate 2 has, on the central part of its top surface, a semiconductor device mounting portion for mounting therein a semiconductor device 7 such as a microprocessor or an ASIC. The semiconductor device 7 is connected, through a conductor bump 8 made of solder such as a tin-lead alloy (Sn—Pb), or gold (Au), to a semiconductor device connecting electrode (not shown) provided in the semiconductor device 7 mounting portion, and is thereby electrically connected to the multi-layer wiring board 1. Further, the insulating substrate 2 has on its under surface a plurality of external electrodes 6 including one for supplying electric power to the semiconductor device 7.

Figure 2:
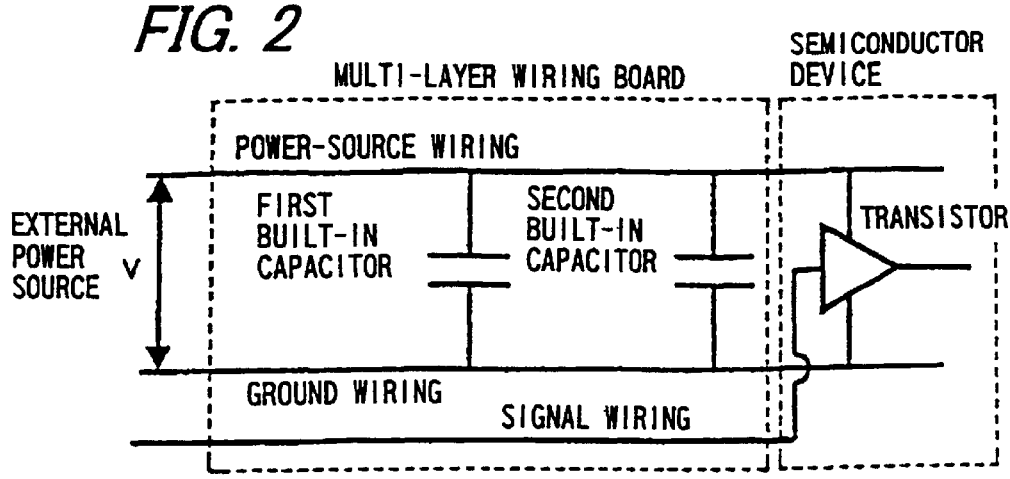
FIG. 2 is an electric circuit diagram showing one example of impedance characteristics of a built-in capacitor of the multi-layer wiring board embodying the invention.

According to the embodiment shown in FIGS. 1A to 1G, for example, the power source wiring line 3a2, 3b2, 3c2, 3d2, led from one of the external electrodes 6 shown in FIG. 1G, is connected to the power source wiring layer 4b through the through conductor 10b shown in FIG. 1F; is connected to the power source wiring layer 5b through the through conductor 10b shown in FIGS. 1D and 1E; and is connected to the semiconductor-device connecting electrode of the mounting portion through the through conductor 10b shown in FIGS. 1B and 1C. Meanwhile, the ground wiring line 3a3, 3b3, 3c3, 3d3, led from one of the external electrodes 6 shown in FIG. 1G, is connected to the ground wiring layer 4a through the through conductor 10a shown in FIGS. 1E and 1F; is connected to the ground wiring layer 5a through the through conductor 10a shown in FIGS. 1C and 1D; and is connected to the semiconductor-device connecting electrode of the mounting portion through the through conductor 10a shown in FIG. 1B. Thereby, between the power source wiring layer 4b and the ground wiring layer 4a is formed the first built-in capacitor 4, and between the power source wiring layer 5b and the ground wiring layer 5a is formed the second built-in capacitor 5. The electric circuit thus obtained is illustrated in the electric circuit diagram shown in FIG. 2. As will be understood from FIG. 2, the two built-in capacitors 4 and 5 are connected in parallel with each other.

Moreover, in the embodiment shown in FIGS. 1A to 1G, the ground wiring layer and/or the power source wiring layer 4a, 4b, acting as the electrode of the first built-in capacitor 4, is made larger in area than the ground wiring layer and/or the power source wiring layer 5a, 5b, acting as the electrode of the second built-in capacitor 5. By so doing, the first built-in capacitor 4, formed between the power source wiring layer and/or the ground wiring layer 4a, 4b, is made different in capacitance value than the second built-in capacitor 5, formed between the power source wiring layer and/or the ground wiring layer 5a, 5b. Hence, as shown in FIG. 3, the impedance characteristics are such that the built-in capacitors have mutually different resonance frequencies.

Figure 3:
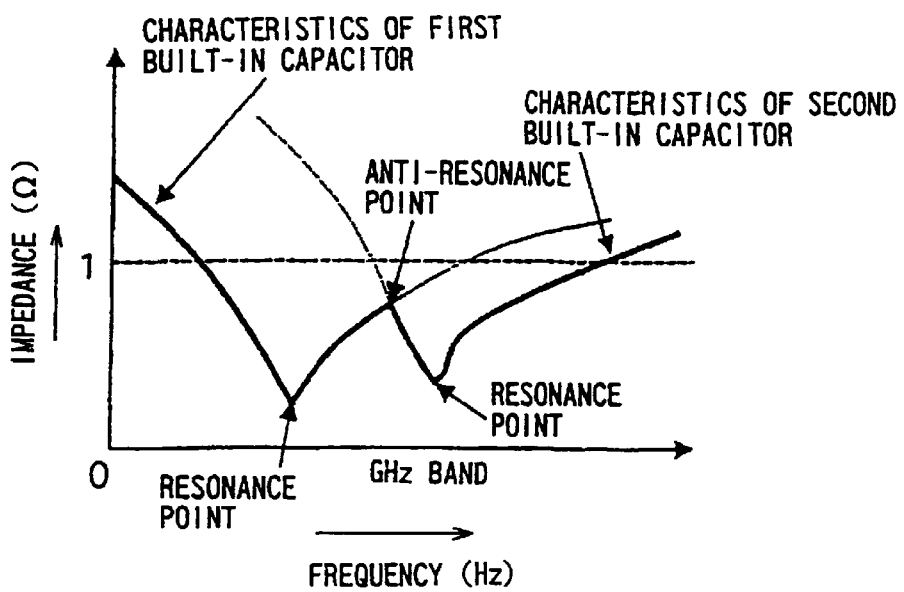
FIG. 3 is a chart showing one example of the impedance characteristics of the built-in capacitor of the multi-layer wiring board embodying the invention.

FIG. 3 is a chart showing one example of the impedance characteristics of in the built-in capacitors 4, 5 of the multi-layer wiring board 1 embodying the invention. In FIG. 3, frequencies (Hz) are taken along the horizontal axis, and the impedance values (Ω) for the built-in capacitors 4 and 5 are taken along the vertical axis. Note that, in the built-in capacitor 4, 5 formed within the multi-layer wiring board 1, there is a tendency that, in a region of frequencies lower than the resonance frequency, the impedance characteristics are such that the impedance is given as a capacitance component, whereas in a region of frequencies higher than the resonance frequency, the impedance characteristics are such that the impedance is given as an inductance component. Further, in a case where a plurality of capacitors having different resonance frequencies are arranged in juxtaposition, the impedance characteristics of the individual built-in capacitors 4, 5 are combined together at the intersection (anti-resonance point) of the impedance characteristics, with their resonance frequencies kept intact. Thus, the frequency at the anti-resonance point, namely, the anti-resonance frequency is observed at the intersection of the individual impedance characteristics.

Moreover, the smaller the impedance value for the built-in capacitor 4, 5 constituted by the wider-area power source wiring layer and/or ground wiring layer 4a, 4b, 5a, 5b, the less the simultaneous switching noise can be. In particular, in the high frequency region where the semiconductor device 7 is operated at a frequency of greater than several GHz, a harmonic component appears that is increased in component proportion at a frequency equivalent to an integral multiple of the operating frequency. By reducing in particular the impedance values as observed in the frequency region including frequencies up to ca. 5 times higher than the operating frequency of the semiconductor device 7, in which the harmonic component becomes great, it is possible to reduce the simultaneous switching noise occurring in the semiconductor device 7 operated at high speed.

Here, the impedance value for the built-in capacitor 4, 5 is kept at a minimum at the resonance frequency. According to the multi-layer wiring board 1 embodying the invention, a plurality of the built-in capacitors 4, 5 having different resonance frequencies are arranged in juxtaposition. This arrangement allows each of the built-in capacitors 4, 5 to have its own resonance frequency which is arbitrarily set within the range from the operating frequency band of the semiconductor device 7 to the frequency band of the harmonic component. In the example shown in FIG. 3, the resonance frequency included in the impedance characteristics of the first built-in capacitor 4 is brought into coincidence with the band of the operating frequency of the semiconductor device 7, and the resonance frequency included in the impedance characteristics of the second built-in capacitor 5 is brought into coincidence with the frequency band of the harmonic component.

The resonance frequency included in the impedance characteristics of the built-in capacitor 4, 5 can be arbitrarily set by varying the capacitance value for the built-in capacitor 4, 5 constituted by the wider-area power source wiring layer and/or ground wiring layer 4a, 4b, 5a, 5b. In this example, the capacitance value for the built-in capacitor 4, 5 is varied by making the power source wiring layer and/or the ground wiring layer 4a and 4b different in area than the layers 5a and 5b. In this way, the resonance frequency included in the impedance characteristics of the built-in capacitor 4, 5 can be set at a desired value.

Further, the composite impedance at the anti-resonance frequency occurring between those resonance frequencies is set to be equal to or less than a predetermined value. Thus, in the range from the band of the operating frequency of the semiconductor device 7 to the frequency band of the harmonic component, the composite impedance value can be made smaller over a wider frequency band.

Here, the composite impedance value, observed at the anti-resonance frequency occurring between the resonance frequencies included in the impedance characteristics of a plurality of the built-in capacitors, can be arbitrarily set in accordance with the capacitance values for the individual built-in capacitors and the number of the built-in capacitors. In the multi-layer wiring board embodying the invention, the composite impedance value is determined appropriately, in accordance with the operating frequency of the semiconductor device 7 and the required amount of the simultaneous switching noise, so that the requirements for desired characteristics are satisfied.

Moreover, by setting the composite impedance value at the anti-resonance frequency to be 1 Ω or below, the inductance components included in the power source wiring layer and/or the ground wiring layer 4a, 4b, 5a, 5b can be decreased considerably. Thus, even in the high-frequency region where the semiconductor device 7 is operated at a frequency greater than several GHz, the simultaneous switching noise can be sufficiently reduced in an effective manner.

Setting the composite impedance value at 1 Ω or below is effective at the operating frequency of the semiconductor device 7 falling in a range from 1 to 10 GHz. In this case, the frequency of the harmonic component is kept in a range from 5 to 50 GHz on the basis of a value 5 times higher than the operating frequency of the semiconductor device 7.

Note that, if the anti-resonance frequency, which is included in the impedance characteristics of the built-in capacitor 4, 5 constituted by the wider-area power source wiring layer and/or ground wiring layer 4a, 4b, 5a, 5b formed within the multi-layer wiring board 1, coincides with the operating frequency of the semiconductor device 7 and the harmonic component, EMI noise tends to be increased. In light of this, in the built-in capacitor 4, 5, the anti-resonance frequency included in the impedance characteristics should preferably be set at a value incoincident with the operating frequency of the semiconductor device 7.

Moreover, in the built-in capacitor 4, 5 constituted by the wider-area power source wiring layer and/or ground wiring layer 4a, 4b, 5a, 5b formed within the multi-layer wiring board 1, the resonance and anti-resonance frequencies included in the impedance characteristics thereof are dependent upon the capacitance value for the built-in capacitor 4, 5, the inductance value for the parasitic inductor, the contour and size of the multi-layer wiring board 1, or other factors. Thus, in order to reduce EMI noise more effectively, the capacitance value for the built-in capacitor needs to be adjusted to a desired value.

Note that, as practiced in the embodiment under discussion, it is preferable that, out of the built-in capacitors 4, 5, the one arranged nearer the portion for mounting the semiconductor device 7 is made smaller in electrode size. By so doing, the built-in capacitor 5 arranged nearer the semiconductor device 7 is made higher in resonance frequency than the built-in capacitor 4 arranged away from the semiconductor device 7. Thus, the high-frequency component of the simultaneous switching noise, produced in the power source wiring layer and the ground wiring layer, can be decreased in the vicinity of the semiconductor device 7, whereby making it possible to effectively reduce the simultaneous switching noise and EMI noise.

Figure 4:
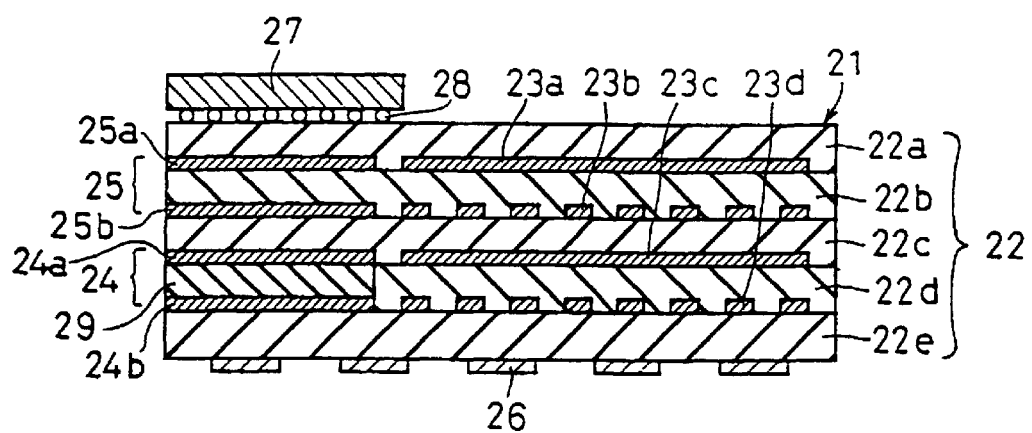
FIG. 4 is sectional view showing the multi-layer wiring board according to a second embodiment of the invention.

FIG. 4 is a sectional view showing the multi-layer wiring board according to a second embodiment of the invention. Note that FIG. 4 illustrates only one of the divided sections described earlier. In FIG. 4, reference numeral 21 represents the multi-layer wiring board, and 22 represents an insulating substrate. The insulating substrate 22 is constituted by stacking a plurality of insulating layers 22a to 22e on top of each other. The insulating layer 22b, 22d corresponds to a first insulating layer. The first insulating layer has it stop surface divided into several sections by, for example, two straight lines intersecting at the center thereof, with the central angles of the sections made substantially equal to each other. On each of the divided sections is formed a first group of parallel wiring lines 23a, 23c composed of a plurality of parallel wiring lines extending toward the intersection. Meanwhile, the insulating layer 22c, 22e corresponds to a second insulating layer. The second insulating layer has its top surface divided into several sections. On each of the divided sections is formed a second group of parallel wiring lines 23b, 23d composed of a plurality of parallel wiring lines which are respectively arranged orthogonal to the parallel wiring lines constituting the first group of the parallel wiring lines 23a, 23c. The first group of parallel wiring lines 23a, 23c and the second group of parallel wiring lines 23b, 23d are electrically connected to each other at the intersection of the upper and lower wiring lines, by a group of through conductors (not shown), as required. As a result, desired paths for the signal wiring line, the power source wiring line, and the ground wiring line are formed, thereby constituting a multilayered wiring.

Numeral symbols 24a, 24b and 25a, 25b respectively represent a wider-area power source wiring layer and/or ground wiring layer formed inside the insulating substrate 22. By way of the power source wiring layer and/or the ground wiring layer 24a, 24b and 25a, 25b, two built-in capacitors, i.e. a first built-in capacitor 24 and a second built-in capacitor 25, are formed within the multi-layer wiring board 21. The built-in capacitors 24 and 25 are connected in parallel with each other by a non-illustrated through conductor or the like.

In this embodiment, the electrode (the power source wiring layer or ground wiring layer) 24a, 24b of the first built-in capacitor 24 is made substantially identical in size with the electrode (the power source wiring layer or ground wiring layer) 25a, 25b of the second built-in capacitor 25. In this case, by designing part of the insulating layer 22d, located between the electrodes 24a and 24b of the first built-in capacitor 24, as a high dielectric constant layer 29, the first built-in capacitor 24 is made larger in capacitance, so that the first and second built-in capacitor shave mutually different resonance frequencies.

In the multi-layer wiring board 21, the insulating substrate 22 has, on the central part of its top surface, a semiconductor device mounting portion for mounting therein a semiconductor device 27. The semiconductor device 27 is connected, through a conductor bump 28, to a semiconductor-device connecting electrode (not shown) provided in the semiconductor device 27 mounting portion, and is thereby electrically connected to the multi-layer wiring board 21. Further, the insulating substrate 22 has on its under surface a plurality of external electrodes 26 including one for supplying electric power to the semiconductor device 27.

Also in the embodiment shown in FIG. 4, for example, the power source wiring line, led from one of the external electrodes 26, is connected to the power source wiring layer 24b through the through conductor; is connected to the power source wiring layer 25b through the through conductor; and is connected to the semiconductor-device connecting electrode of the mounting portion through the through conductor. Meanwhile, the ground wiring line, led from one of the external electrodes 26, is connected to the ground wiring layer 24a through the through conductor; is connected to the ground wiring layer 25a through the through conductor; and is connected to the semiconductor-device connecting electrode of the mounting portion through the through conductor. Thereby, between the power source wiring layer 24b and the ground wiring layer 24a is formed the first built-in capacitor 24 with the high dielectric constant layer 29 interposed therein, and between the power source wiring layer 25b and the ground wiring layer 25a is formed the second built-in capacitor 5 with the insulating layer 22b interposed therein. The electric circuit thus obtained is illustrated in the electric circuit diagram shown in FIG. 2. As will be understood from FIG. 2, the two built-in capacitors 24 and 25 are connected in parallel with each other.

Moreover, in the embodiment shown in FIG. 4, the high dielectric constant layer 29, located between the ground wiring layer and/or the power source wiring layer 24a, 24b acting as the electrodes of the first built-in capacitor 24, is made higher in dielectric constant than the insulating layer 22b located between the ground wiring layer and/or the power source wiring layer 25a, 25b acting as the electrodes of the second built-in capacitor 25. By so doing, the first built-in capacitor 24, formed between the power source wiring layer and/or the ground wiring layer 24a, 24b, is made different in capacitance value than the second built-in capacitor 25 formed between the power source wiring layer and/or the ground wiring layer 25a, 25b. Hence, as in the case of the embodiment shown in FIG. 1, the impedance characteristics are such that the built-in capacitors have mutually different resonance frequencies, as shown in FIG. 3.

As practiced in the second embodiment, it is preferable that the first built-in capacitor 24 and the second built-in capacitor 25 are made different from each other in insulating layer's dielectric constant. By so doing, the built-in capacitor 25 arranged nearer the semiconductor device 27 is made higher in resonance frequency than the built-in capacitor 24 arranged away from the semiconductor device 27. Thus, the high-frequency component of the simultaneous switching noise, produced in the power source wiring layer and the ground wiring layer, can be decreased in the vicinity of the semiconductor device 27, whereby making it possible to effectively reduce the simultaneous switching noise and EMI noise.

Figure 5:
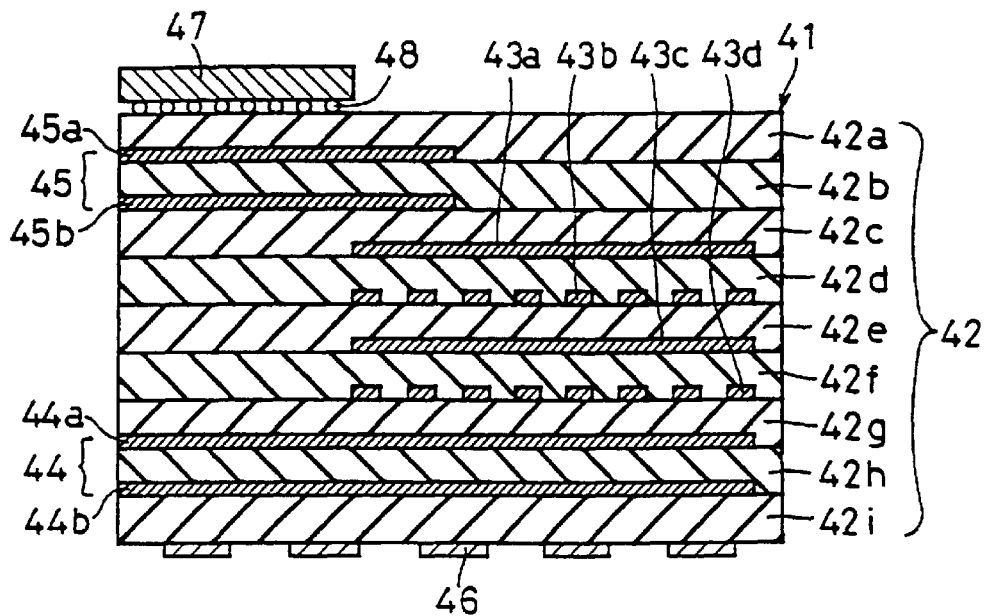
FIG. 5 is sectional view showing the multi-layer wiring board according to a third embodiment of the invention.

FIG. 5 is a sectional view showing the multi-layer wiring board according to a third embodiment of the invention. Note that FIG. 5 illustrates only one of the divided sections described earlier. In FIG. 5, reference numeral 41 represents the multi-layer wiring board, and 42 represents an insulating substrate. The insulating substrate 42 is constituted by stacking a plurality of insulating layers 42a to 42i on top of each other. In the multi-layer wiring board 41 of this example, the insulating layers 42a to 42i are made of insulating materials that are basically identical with each other in relative dielectric constant. Here, the insulating layer 42d, 42f corresponds to a first insulating layer. The first insulating layer has its top surface divided into several sections by two to four straight lines, for example, two straight lines intersecting at the center thereof, with the central angles of the sections made substantially equal to each other. On each of the divided sections is formed a first group of parallel wiring lines 43a, 43c composed of a plurality of parallel wiring lines extending toward the intersection. Meanwhile, the insulating layer 42e, 42g corresponds to a second insulating layer. The second insulating layer has its top surface divided into several sections. On each of the divided sections is formed a second group of parallel wiring lines 43b, 43d composed of a plurality of parallel wiring lines which are respectively arranged orthogonal to the parallel wiring lines constituting the first group of the parallel wiring lines 43a, 43c. The first group of parallel wiring lines 43a, 43c and the second group of parallel wiring lines 43b, 43d are electrically connected to each other at the intersection of the upper and lower wiring lines, by a group of through conductors (not shown), as required. As a result, desired paths for the signal wiring line, the power source wiring line, and the ground wiring line are formed, thereby constituting a multilayered wiring.

Numeral symbols 44a, 44b and 45a, 45b respectively represent a wider-area power source wiring layer and/or ground wiring layer formed inside the insulating substrate 42. The power source wiring layer and/or the ground wiring layer are formed on a layer other than that on which the first and second groups of parallel wiring lines 43a to 43d are formed. In this embodiment, by way of the power source wiring layer and/or the ground wiring layer 44a, 44b and 45a, 45b, two built-in capacitors, i.e. a first built-in capacitor 44 and a second built-in capacitor 45, are formed within the multi-layer wiring board 41. The built-in capacitors 44 and 45 are connected in parallel with each other by a non-illustrated through conductor or the like.

As stated above, it is preferable that the wider-area power source wiring layer and/or ground wiring layer 44a, 44b and 45a, 45b, constituting the first and second built-in capacitors 44 and 45, are formed on a layer other than that on which the first and second groups of parallel wiring lines 43a to 43d are formed. By so doing, as compared with the case where those wiring layers are formed on the same layer as the second group of parallel wiring lines 43a, 43b, a larger capacitance can be secured, thereby achieving a lower impedance over a wider range of frequencies from a lower-frequency region to a higher-frequency region.

In this embodiment, the electrode (the power source wiring layer or ground wiring layer) 45a, 45b of the second built-in capacitor 45 is made smaller in size than the electrode (the power source wiring layer or ground wiring layer) 44a, 44b of the first built-in capacitor 44. By so doing, the second built-in capacitor 45 is made smaller in capacitance, so that the first and second built-in capacitors have mutually different resonance frequencies.

In the multi-layer wiring board 41, the insulating substrate 42 has, on the central part of its top surface, a semiconductor device mounting portion for mounting therein a semiconductor device 47. The semiconductor device 47 is connected, through a conductor bump 48, to a semiconductor device connecting electrode (not shown) provided in the semiconductor device 47 mounting portion, and is thereby electrically connected to the multi-layer wiring board 41. Further, the insulating substrate 42 has on its under surface a plurality of external electrodes 46 including one for supplying electric power to the semiconductor device 47.

According to the embodiment shown in FIG. 5, for example, the power source wiring line, led from one of the external electrodes 46, is connected to the power source wiring layer 44b through the through conductor; is connected to the power source wiring layer 45b through the through conductor; and is connected to the semiconductor-device connecting electrode of the mounting portion through the through conductor. Meanwhile, the ground wiring line, led from one of the external electrodes 46, is connected to the ground wiring layer 44a through the through conductor; is connected to the ground wiring layer 45a through the through conductor; and is connected to the semiconductor-device connecting electrode of the mounting portion through the through conductor. Thereby, between the power source wiring layer 44b and the ground wiring layer 44a is formed the first built-in capacitor 44, and between the power source wiring layer 45b and the ground wiring layer 45a is formed the second built-in capacitor 45. The electric circuit thus obtained is illustrated in the electric circuit diagram shown in FIG. 2. As will be understood from FIG. 2, the two built-in capacitors 44 and 45 are connected in parallel with each other.

Moreover, in the embodiment shown in FIG. 5, the ground wiring layer and/or the power source wiring layer 45a, 45b, acting as the electrode of the second built-in capacitor 45, is made smaller in area than the ground wiring layer and/or the power source wiring layer 44a, 44b, acting as the electrode of the first built-in capacitor 44. By so doing, the first built-in capacitor 44, formed between the power source wiring layer and/or the ground wiring layer 44a, 44b, is made different in capacitance value than the second built-in capacitor 45, formed between the power source wiring layer and/or the ground wiring layer 45a, 45b. Hence, as shown in FIG. 3, the impedance characteristics are such that the built-in capacitors have mutually different resonance frequencies.

Also in this embodiment, out of the built-in capacitors 44, 45, the one arranged nearer the portion for mounting the semiconductor device 47 is made smaller in electrode size. By so doing, the built-in capacitor 45 arranged nearer the semiconductor device 47 is made higher in resonance frequency than the built-in capacitor 44 arranged away from the semiconductor device 47. Thus, the high-frequency component of the simultaneous switching noise, produced in the power source wiring layer and the ground wiring layer, can be decreased in the vicinity of the semiconductor device 47, whereby making it possible to effectively reduce the simultaneous switching noise and EMI noise.

Figure 6:
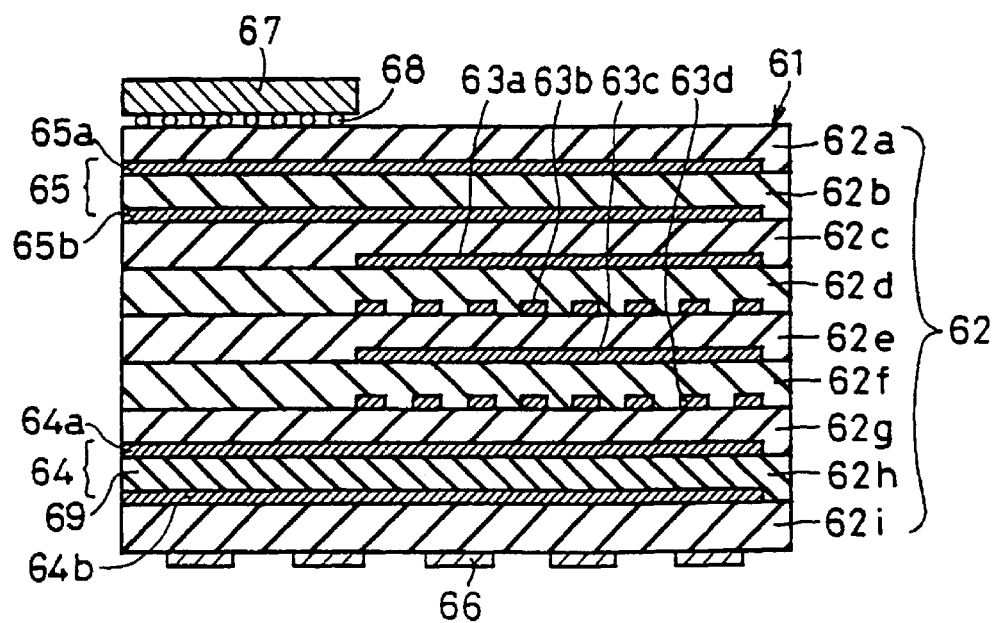
FIG. 6 is sectional view showing the multi-layer wiring board according to a fourth embodiment of the invention.

FIG. 6 is a sectional view showing the multi-layer wiring board according to a fourth embodiment of the invention. Note that FIG. 6 illustrates only one of the divided sections described earlier. In FIG. 6, reference numeral 61 represents the multi-layer wiring board, and 62 represents an insulating substrate. The insulating substrate 62 is constituted by stacking a plurality of insulating layers 62a to 62i on top of each other. The insulating layer 62d, 62f corresponds to a first insulating layer. The first insulating layer has its top surface divided into several sections by two to four straight lines, for example, two straight lines intersecting at the center thereof, with the central angles of the sections made substantially equal to each other. On each of the divided sections is formed a first group of parallel wiring lines 63a, 63c composed of a plurality of parallel wiring lines extending toward the intersection. Meanwhile, the insulating layer 62e, 62g corresponds to a second insulating layer. The second insulating layer has its top surface divided into several sections. On each of the divided sections is formed a second group of parallel wiring lines 63b, 63d composed of a plurality of parallel wiring lines which are respectively arranged orthogonal to the parallel wiring lines constituting the first group of the parallel wiring lines 63a, 63c. The first group of parallel wiring lines 63a, 63c and the second group of parallel wiring lines 63b, 63d are electrically connected to each other at the intersection of the upper and lower wiring lines, by a group of through conductors (not shown), as required. As a result, desired paths for the signal wiring line, the power source wiring line, and the ground wiring line are formed, thereby constituting a multilayered wiring.

Numeral symbols 64a, 64b and 65a, 65b respectively represent a wider-area power source wiring layer and/or ground wiring layer formed inside the insulating substrate 62. The power source wiring layer and/or the ground wiring layer are formed on a layer other than that on which the first and second groups of parallel wiring lines 63a to 63d are formed. By way of the power source wiring layer and/or the ground wiring layer 64a, 64b and 65a, 65b, two built-in capacitors, i.e. a first built-in capacitor 64 and a second built-in capacitor 65, are formed within the multi-layer wiring board 61. The built-in capacitors 64 and 65 are connected in parallel with each other by a non-illustrated through conductor or the like.

In this embodiment, the electrode (the power source wiring layer or ground wiring layer) 64a, 64b of the first built-in capacitor 64 is made substantially identical in size with the electrode (the power source wiring layer or ground wiring layer) 65a, 65b of the second built-in capacitor 65. In this case, by designing the insulating layer 62h, located between the electrodes 64a and 64b of the first built-in capacitor 64, as a high dielectric constant layer 69, the first built-in capacitor 64 is made larger in capacitance, so that the first and second built-in capacitors have mutually different resonance frequencies.

In the multi-layer wiring board 61, the insulating substrate 62 has, on the central part of its top surface, a semiconductor device mounting portion for mounting therein a semiconductor device 67. The semiconductor device 67 is connected, through a conductor bump 68, to a semiconductor device connecting electrode (not shown) provided in the semiconductor device 67 mounting portion, and is thereby electrically connected to the multi-layer wiring board 61. Further, the insulating substrate 62 has on its under surface a plurality of external electrodes 66 including one for supplying electric power to the semiconductor device 67.

Also in the embodiment shown in FIG. 6, for example, the power source wiring line, led from one of the external electrodes 66, is connected to the power source wiring layer 64b through the through conductor; is connected to the power source wiring layer 65b through the through conductor; and is connected to the semiconductor-device connecting electrode of the mounting portion through the through conductor. Meanwhile, the ground wiring line, led from one of the external electrodes 66, is connected to the ground wiring layer 64a through the through conductor; is connected to the ground wiring layer 65a through the through conductor; and is connected to the semiconductor-device connecting electrode of the mounting portion through the through conductor. Thereby, between the power source wiring layer 64b and the ground wiring layer 64a is formed the first built-in capacitor 64 with the high dielectric constant layer 69 interposed therein, and between the power source wiring layer 65b and the ground wiring layer 65a is formed the second built-in capacitor 65 with the insulating layer 62b interposed therein. The electric circuit thus obtained is similarly illustrated in the electric circuit diagram shown in FIG. 2. As will be understood from FIG. 2, the two built-in capacitors 64 and 65 are connected in parallel with each other.

Moreover, in the embodiment shown in FIG. 6, the high dielectric constant layer 69, located between the ground wiring layer and/or the power source wiring layer 64a, 64b acting as the electrodes of the first built-in capacitor 64, is made higher in dielectric constant than the insulating layer 62b located between the ground wiring layer and/or the power source wiring layer 65a, 65b acting as the electrodes of the second built-in capacitor 65. By so doing, the first built-in capacitor 64, formed between the power source wiring layer and/or the ground wiring layer 64a, 64b, is made different in capacitance value than the second built-in capacitor 65 formed between the power source wiring layer and/or the ground wiring layer 65a, 65b. Hence, as in the case of the embodiment shown in FIG. 5, the impedance characteristics are such that the built-in capacitors have mutually different resonance frequencies, as shown in FIG. 3.

As practiced in this embodiment, it is preferable that the first built-in capacitor 64 and the second built-in capacitor 65 are made different from each other in insulating layer's dielectric constant. By so doing, the built-in capacitor 65 arranged nearer the semiconductor device 67 is made higher in resonance frequency than the built-in capacitor 64 arranged away from the semiconductor device 67. Thus, the high-frequency component of the simultaneous switching noise, produced in the power source wiring layer and the ground wiring layer, can be decreased in the vicinity of the semiconductor device 67, whereby making it possible to effectively reduce the simultaneous switching noise and EMI noise.

Figure 7:
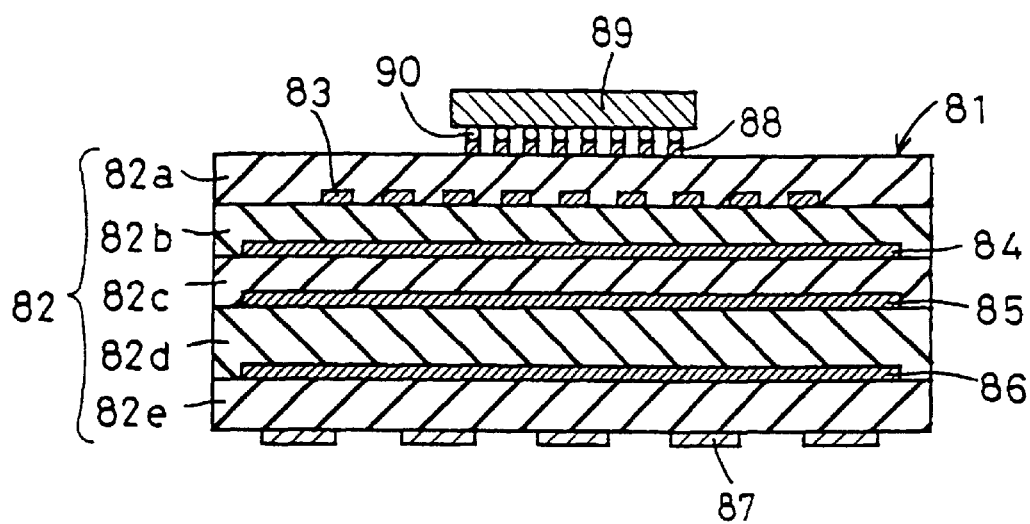
FIG. 7 is sectional view showing the multi-layer wiring board according to a fifth embodiment of the invention.

FIG. 7 is a sectional view showing the multi-layer wiring board according to a fifth embodiment of the invention. In FIG. 7, reference numeral 81 represents the multi-layer wiring board, and 82 represents an insulating substrate. The insulating substrate 82 is constituted by stacking a plurality of insulating layers 82a to 82e on top of each other. In the multi-layer wiring board 81 of this embodiment, the insulating layers 82a to 82e are made of insulating materials that are basically identical with each other in relative dielectric constant. On the insulating layer 82b is formed a group of signal wiring lines 83, and on the insulating layer 82c is formed a wider-area power source wiring layer and/or ground wiring layer 84 so as to oppose the group of signal wiring lines 83. Thus, the group of signal wiring lines 83 takes on a micro-strip line structure.

In this way, by arranging the wider-area power source wiring layer and/or ground wiring layer 84 so as to oppose the group of signal wiring lines 83, the electromagnetic coupling between the signal wiring lines included in the group of signal wiring lines 83 is reduced, whereby making it possible to reduce the cross-talk noise occurring between the signal wiring lines. Moreover, by properly controlling and setting the width of the signal wiring line and the thickness of the insulating layer 82b interposed between the group of signal wiring lines 83 and the power source wiring layer or ground wiring layer 84, the characteristic impedance of the group of signal wiring lines 83 can be set at a given value. This allows the group of signal wiring lines 83 to exhibit excellent signal transmission characteristics. In general, the characteristic impedance of the group of signal wiring lines 83 is set at 50 Ω.

Note that a plurality of the signal wiring lines, included in the group of signal wiring lines 83, may be so designed as to transmit mutually different electric signals.

In this embodiment, on the top surface of the multi-layer wiring board 81 is mounted a semiconductor device 89 such as a microprocessor or an ASIC. The semiconductor device 89 is electrically connected to the multi-layer wiring board 81 through a conductor bump 90 made of solder such as at in-lead alloy (Sn—Pb), or gold (Au), and a semiconductor-device connecting electrode 88 for providing connection with the semiconductor device 89. Further, the multi-layer wiring board 81 has, on its under surface opposite to the top surface on which the semiconductor device 89 is mounted, an external electrode 87 for supplying electric power to the semiconductor device 89.

Reference numerals 85 and 86, in common with 84, represent a wider-area power source wiring layer and/or ground wiring layer. In this embodiment, byway of the power source wiring layer and/or the ground wiring layer 84 to 86, two built-in capacitors are formed within the multi-layer wiring board 81. The built-in capacitors are arranged in juxtaposition. Hereupon, the arrangement of the power source wiring layer and/or the ground wiring layer 84, 85, 86 is made in such a way that the layers of different natures are arranged contiguous to each other. That is, on the one hand, if 84 and 86 are defined as the power source wiring layer, 85 is defined as the ground wiring layer, and on the other hand, if 84 and 86 are defined as the ground wiring layer, 85 is defined as the power source wiring layer.

The above-described arrangement will be described in detail with reference to FIG. 9.

Figure 8:
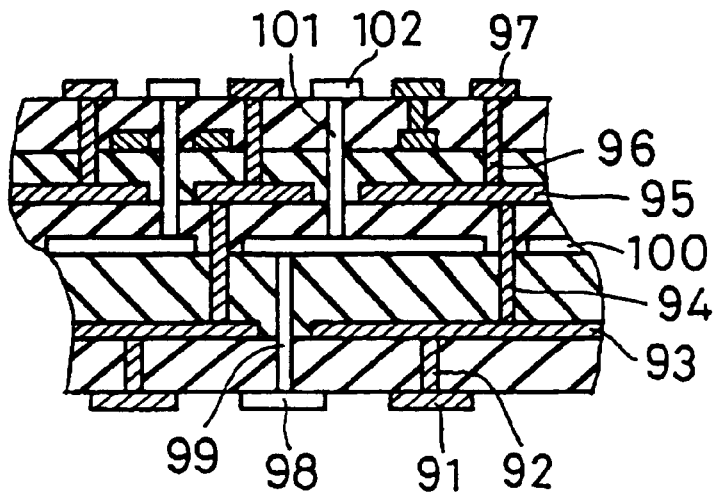
FIG. 8 is a sectional view showing part of one example of the multi-layer wiring board embodying the invention.

FIG. 8 is a sectional view showing part of one example of the multi-layer wiring board embodying the invention. This example is directed to the construction shown in FIG. 7 in which 84 and 86 are defined as the power source wiring layer, and 85 is defined as the ground wiring layer. In FIG. 8, a power source wiring layer 93, 95 corresponds to the power source wiring layer and/or the ground wiring layer 86, 84 shown in FIG. 7, and a ground wiring layer 100 corresponds to the power source wiring layer and/or the ground wiring layer 85 shown in FIG. 7. In FIG. 8, the power source wiring line, led from an external electrode 91, is connected to the power source wiring layer 93 through a via hole 92; is connected to the power source wiring layer 95 through a via hole 94; and is connected to a semiconductor-device connecting electrode 97 through a via hole 96. Meanwhile, the ground wiring line, led from an external electrode 98, is connected to the ground wiring layer 100 through a via hole 99; and is connected to a semiconductor-device connecting electrode 102 through a via hole 101. Thereby, between the power source wiring layer 93 and the ground wiring layer 100 is formed the first built-in capacitor, and between the power source wiring layer 95 and the ground wiring layer 100 is formed the second built-in capacitor. The electric circuit thus obtained is illustrated in the electric circuit diagram shown in FIG. 2. As will be understood from FIG. 2, the two built-in capacitors are connected in parallel with each other.

Figure 9:
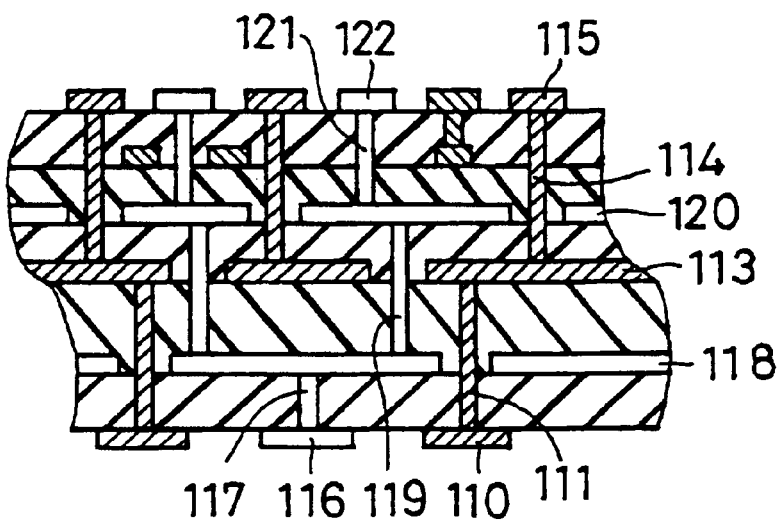
FIG. 9 is a sectional view showing part of another example of the multi-layer wiring board embodying the invention.

FIG. 9 is a sectional view showing part of another example of the multi-layer wiring board embodying the invention. This example is directed to the construction shown in FIG. 7 in which 84 and 86 are defined as the ground wiring layer, and 85 is defined as the power source wiring layer. In FIG. 9, a ground wiring layer 118, 120 corresponds to the power source wiring layer and/or the ground wiring layer 86, 84 shown in FIG. 7, and a power source wiring layer 113 corresponds to the power source wiring layer and/or the ground wiring layer 85 shown in FIG. 7, In FIG. 9, the ground wiring line, led from an external electrode 116, is connected to the ground wiring layer 118 through a via hole 117; is connected to the ground wiring layer 120 through a via hole 119; and is connected to a semiconductor-device connecting electrode 122 through a via hole 121. Mean while, the power source wiring line, led from an external electrode 111, is connected to the power source wiring layer 113 through a via hole 112; and is connected to a semiconductor-device connecting electrode 115 through a via hole 114. Thereby, between the ground wiring layer 118 and the power source wiring layer 113 is formed the first built-in capacitor, and between the ground wiring layer 120 and the power source wiring layer 113 is formed the second built-in capacitor. The electric circuit thus obtained is similarly illustrated in the electric circuit diagram shown in FIG. 2. Also in this case, the two built-in capacitors are connected in parallel with each other.

In the embodiment shown in FIG. 7, the insulating layer 82d, which has on its top surface the power source wiring layer and/or the ground wiring layer 85, is made larger in thickness than the insulating layer 82c which has on its top surface the power source wiring layer and/or the ground wiring layer 84. By so doing, the first built-in capacitor, formed between the power source wiring layer and/or the ground wiring layer 84 and 85, is made different in capacitance value than the second built-in capacitor formed between the power source wiring layer and/or the ground wiring layer 85 and 86. Hence, as shown in FIG. 3, the impedance characteristics are such that the built-in capacitors have mutually different resonance frequencies.

Moreover, the smaller the impedance value for the built-in capacitor constituted by the wider-area power source wiring layer and/or ground wiring layer 84 to 86, the less the simultaneous switching noise can be. In particular, in the high frequency region where the semiconductor device 89 is operated at a frequency of greater than several GHz, a harmonic component appears that is increased in component proportion at a frequency equivalent to an integral multiple of the operating frequency. By reducing in particular the impedance values as observed in the frequency region including frequencies up to ca. 5 times higher than the operating frequency of the semiconductor device 89, in which the harmonic component becomes great, it is possible to reduce the simultaneous switching noise occurring in the semiconductor device 89 operated at high speed.

Here, the impedance value for the built-in capacitor is kept at a minimum at the resonance frequency. According to the multi-layer wiring board 81 embodying the invention, a plurality of the built-in capacitors having different resonance frequencies are arranged in juxtaposition. This arrangement allows each of the built-in capacitors to have its own resonance frequency which is arbitrarily set within the range from the operating frequency band of the semiconductor device 89 to the frequency band of the harmonic component. In the example shown in FIG. 3, the resonance frequency included in the impedance characteristics of the first built-in capacitor is brought into coincidence with the band of the operating frequency of the semiconductor device 89, and the resonance frequency included in the impedance characteristics of the second built-in capacitor is brought into coincidence with the frequency band of the harmonic component. The resonance frequency included in the impedance characteristics of the built-in capacitor can be arbitrarily set by varying the capacitance value for the built-in capacitor constituted by the wider-area power source wiring layer and/or ground wiring layer 84 to 86. In this example, the capacitance value for the built-in capacitor is varied by varying the thickness of the insulating layers 82c and 82d, on which the power source wiring layer and/or the ground wiring layer 84, 85 are formed. In this way, the resonance frequency included in the impedance characteristics of the built-in capacitor can be set at a desired value. Note that, in this example, the insulating layer 82d having there on the second built-in capacitor is made 1.5 times larger in thickness than the insulating layer 82c having thereon the first built-in capacitor.

Further, the composite impedance at the anti-resonance frequency occurring between those resonance frequencies is set to be equal to or less than a predetermined value. Thus, in the range from the band of the operating frequency of the semiconductor device 89 to the frequency band of the harmonic component, the composite impedance value can be made smaller over a wider frequency band. Here, the composite impedance value, which is observed at the anti-resonance frequency occurring between the resonance frequencies included in the impedance characteristics of a plurality of the built-in capacitors, can be arbitrarily set in accordance with the capacitance values for the individual built-in capacitors and the number of the built-in capacitors. In the multi-layer wiring board 81 embodying the invention, the composite impedance value is determined appropriately, in accordance with the operating frequency of the semiconductor device 89 and the required amount of the simultaneous switching noise, so that the requirements for desired characteristics are satisfied.

Moreover, by setting the composite impedance value at the anti-resonance frequency to be 1 Ω or below, the inductance components included in the power source wiring layer and/or the ground wiring layer 84 to 86 can be decreased considerably. Thus, even in the high-frequency region where the semiconductor device 89 is operated at a frequency greater than several GHz, the simultaneous switching noise can be sufficiently reduced in an effective manner. Setting the composite impedance value at 1 Ω or below is effective at the operating frequency of the semiconductor device 89 falling in a range from 1 to 10 GHz. In this case, the frequency of the harmonic component is kept in a range from 5 to 50 GHz on the basis of a value 5 times higher than the operating frequency of the semiconductor device 89.

Note that, if the anti-resonance frequency, which is included in the impedance characteristics of the built-in capacitor constituted by the wider-area power source wiring layer and/or ground wiring layer 84 to 86 formed within the multi-layer wiring board 81, coincides with the operating frequency of the semiconductor device 89, EMI noise tends to be increased. In light of this, in the built-in capacitor, the anti-resonance frequency included in the impedance characteristics should preferably be set at a value incoincident with the operating frequency of the semiconductor device 89. This helps reduce the EMI noise more effectively.

In the multi-layer wiring board 81 embodying the invention, the resonance frequencies included in the impedance characteristics of a plurality of the built-in capacitors are set appropriately, whereby making it possible to set the anti-resonance frequency at a value incoincident with the operating frequency of the semiconductor device 89. This helps reduce the EMI noise more effectively.

Figure 10:
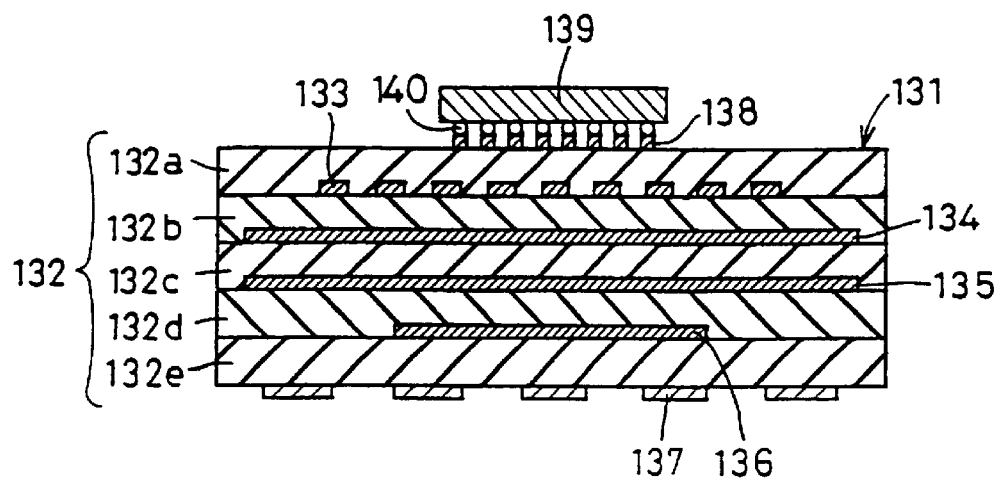
FIG. 10 is sectional view showing the multi-layer wiring board according to a sixth embodiment of the invention.

Next, with reference to FIGS. 10 and 11, a description will be given as to the multi-layer wiring board according to a sixth and a seventh embodiment of the invention. FIG. 10 is a sectional view showing the multi-layer wiring board according to the sixth embodiment of the invention. In FIG. 10, reference numeral 131 represents the multi-layer wiring board, and 132 represents an insulating substrate. The insulating substrate 132 is constituted by stacking a plurality of insulating layers 132a to 132e on top of each other. In the multi-layer wiring board 131 of this embodiment, the insulating layers 132a to 132e are made of insulating materials that are basically identical with each other in relative dielectric constant. On the insulating layer 132b is formed a group of signal wiring lines 133, and on the insulating layer 132c is formed a wider-area power source wiring layer and/or ground wiring layer 134 so as to oppose the group of signal wiring lines 133. Thus, the group of signal wiring lines 133 takes on a micro-strip line structure.

Note that a plurality of the signal wiring lines, included in the group of signal wiring lines 133, may be so designed as to transmit mutually different electric signals.

In this embodiment, on the top surface of the multi-layer wiring board 131 is mounted a semiconductor device 139 such as a microprocessor or an ASIC. The semiconductor device 139 is electrically connected to the multi-layer wiring board 131 through a conductor bump 140 made of solder such as a tin-lead alloy (Sn—Pb), or gold (Au), and a semiconductor-device connecting electrode 138 for providing connection with the semiconductor device 139. Further, the multi-layer wiring board 131 has, on its under surface opposite to the top surface on which the semiconductor device 139 is mounted, an external electrode 137 for supplying electric power to the semiconductor device 139.

Reference numerals 135 and 136, in common with 134, represent a wider-area power source wiring layer and/or ground wiring layer. In this embodiment, by way of the power source wiring layer and/or the ground wiring layer 134 to 136, two built-in capacitors are formed within the multi-layer wiring board 131. The built-in capacitors are arranged in juxtaposition. Hereupon, the arrangement of the power source wiring layer and the ground wiring layer 134, 135, 136 is made in such a way that the layers of different natures are arranged contiguous to each other. That is, on the one hand, if 134 and 136 are defined as the power source wiring layer, 135 is defined as the ground wiring layer, and on the other hand, if 134 and 136 are defined as the ground wiring layer, 135 is defined as the power source wiring layer.

Further, in this embodiment, the power source wiring layer and/or the ground wiring layer 134 and 135 are formed as wider-area wiring layers having substantially the same area, and the power source wiring layer and/or the ground wiring layer 136 is formed as a wider-area wiring layer which is narrower in area than the power source wiring layer and/or the ground wiring layer 134 and 135. Thus, between the power source wiring layer and/or the ground wiring layer 134 and 135 is formed the first built-in capacitor, and between the power source wiring layer and/or the ground wiring layer 135 and 136 is formed the second built-in capacitor, which is smaller than the first built-in capacitor in the area of the opposed surfaces of the power source wiring layer and the ground wiring layer. Being different from each other in the area of the opposed surfaces of the power source wiring layer and the ground wiring layer, the built-in capacitors have mutually different capacitance values. Hence, as shown in FIG. 3, the impedance characteristics are such that the built-in capacitors have mutually different resonance frequencies.

In this embodiment, the resonance frequency included in the impedance characteristics of the first built-in capacitor is brought into coincidence with the band of the operating frequency of the semiconductor device 139, and the resonance frequency included in the impedance characteristics of the second built-in capacitor is brought into coincidence with the frequency band of the harmonic component. The resonance frequency included in the impedance characteristics of the built-in capacitor can be arbitrarily set by varying the capacitance value for the built-in capacitor constituted by the wider-area power source wiring layer and/or ground wiring layer 134 to 136. In this embodiment, the capacitance value for the built-in capacitor is varied by varying the areas of the wider-area wiring layers constituting the power source wiring layer and/or the ground wiring layer 134 to 136. In this way, the resonance frequency included in the impedance characteristics of the built-in capacitor can be set at a desired value.

Further, the composite impedance at the anti-resonance frequency occurring between those resonance frequencies is set to be equal to or less than a predetermined value. Thus, in the range from the band of the operating frequency of the semiconductor device 139 to the frequency band of the harmonic component, the composite impedance value can be made smaller over a wider frequency band. In particular, by setting the composite impedance value at the anti-resonance frequency to be 1 Ω or below, the inductance components included in the power source wiring layer and/or the ground wiring layer 134 to 136 can be decreased considerably. Thus, even in the high-frequency region where the semiconductor device 139 is operated at a frequency greater than several GHz, the simultaneous switching noise can be sufficiently reduced in an effective manner.

Also in this embodiment, by appropriately setting the resonance frequencies included in the impedance characteristics of a plurality of the built-in capacitors, the anti-resonance frequency can be set at a value incoincident with the operating frequency of the semiconductor device 139. This helps reduce the EMI noise more effectively.

With this structure, it is possible to secure a sufficiently wide setting frequency range for the resonance frequency included in the impedance characteristics, as compared with the case where a plurality of the built-in capacitors are made different from each other in resonance frequency by varying the thickness of the insulating layer. This makes it possible to cope with the semiconductor device 139 operated at increasingly higher speed.

Note that, in this embodiment, the power source wiring layer or ground wiring layer 136 is made smaller in area than the power source wiring layer or ground wiring layer 134. However, even if the power source wiring layer or ground wiring layer 134 is made smaller in area than the power source wiring layer or ground wiring layer 136, substantially the same effects are obtained.

Figure 11:
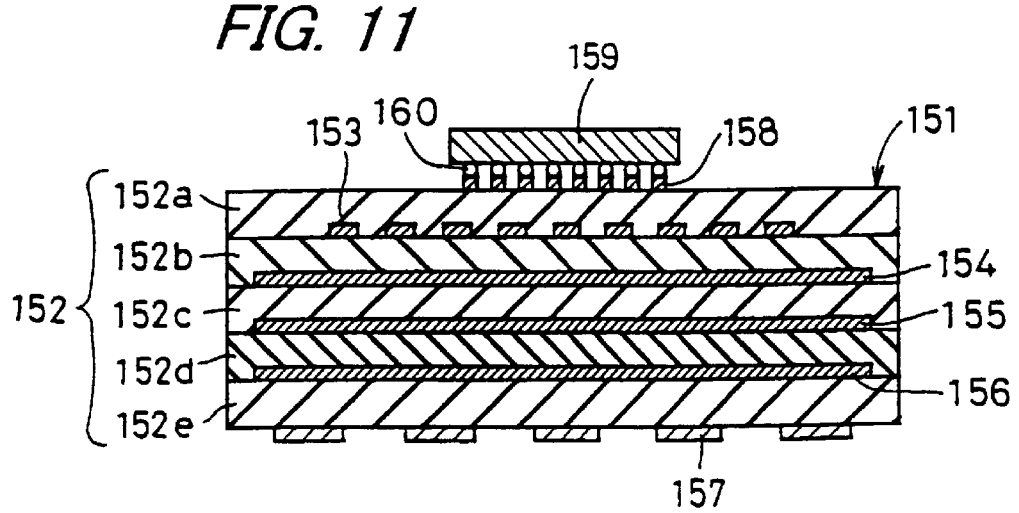
FIG. 11 is sectional view showing the multi-layer wiring board according to a seventh embodiment of the invention.

FIG. 11 is a sectional view showing the multi-layer wiring board according to the seventh embodiment of the invention. In FIG. 11, reference numeral 151 represents the multi-layer wiring board, and 152 represents an insulating substrate. The insulating substrate 152 is constituted by stacking a plurality of insulating layers 152a to 152e on top of each other. In the multi-layer wiring board 151 of this embodiment, the insulating layers 152a to 152c, and 152e are made of insulating materials that are basically identical with each other in relative dielectric constant. On the insulating layer 152b is formed a group of signal wiring lines 153, and on the insulating layer 152c is formed a wider-area power source wiring layer and/or ground wiring layer 154 so as to oppose the group of signal wiring lines 153. Thus, the group of signal wiring lines 153 takes on a micro-strip line structure.

Note that a plurality of the signal wiring lines, included in the group of signal wiring lines 153, may be so designed as to transmit mutually different electric signals.

In this embodiment, on the top surface of the multi-layer wiring board 151 is mounted a semiconductor device 159 such as a microprocessor or an ASIC. The semiconductor device 159 is electrically connected to the multi-layer wiring board 151 through a conductor bump 160 made of solder such as a tin-lead alloy (Sn—Pb), or gold (Au), and a semiconductor-device connecting electrode 158 for providing connection with the semiconductor device 159. Further, the multi-layer wiring board 151 has, on its under surface opposite to the top surface on which the semiconductor device 159 is mounted, an external electrode 157 for supplying electric power to the semiconductor device 159.

Reference numerals 155 and 156, in common with 154, represent a wider-area power source wiring layer and/or ground wiring layer. In this embodiment, by way of the power source wiring layer and/or the ground wiring layer 154 to 156, two built-in capacitors are formed within the multi-layer wiring board 151. The built-in capacitors are arranged in juxtaposition. Hereupon, the arrangement of the power source wiring layer and/or the ground wiring layer 154, 155, 156 is made in such a way that the layers of different natures are arranged contiguous to each other. That is, on the one hand, if 154 and 156 are defined as the power source wiring layer, 155 is defined as the ground wiring layer, and on the other hand, if 154 and 156 are defined as the ground wiring layer, 155 is defined as the power source wiring layer.

In this embodiment, the insulating layer 152d, which has on its top surface the power source wiring layer and/or the ground wiring layer 154, is made of an insulating material which is larger in relative dielectric constant than that used for the insulating layer 152c which has on its top surface the power source wiring layer and/or the ground wiring layer 154. By so doing, the first built-in capacitor, formed between the power source wiring layer and/or the ground wiring layer 154 and 155, is made different in capacitance value than the second built-in capacitor formed between the power source wiring layer and/or the ground wiring layer 155 and 156. Hence, as shown in FIG. 3, the impedance characteristics are such that the built-in capacitors have mutually different resonance frequencies.

In this embodiment, the resonance frequency included in the impedance characteristics of the first built-in capacitor is brought into coincidence with the band of the operating frequency of the semiconductor device 159, and the resonance frequency included in the impedance characteristics of the second built-in capacitor is brought into coincidence with the frequency band of the harmonic component. The resonance frequency included in the impedance characteristics of the built-in capacitor can be arbitrarily set by varying the capacitance value for the built-in capacitor constituted by the wider-area power source wiring layer and/or ground wiring layer 154 to 156. In this embodiment, the capacitance value for the built-in capacitor is varied by varying the relative dielectric constant of the insulating layer 152c or 152d, on which the power source wiring layer and/or the ground wiring layer 154, 155 are formed. In this way, the resonance frequency included in the impedance characteristics of the built-in capacitor can be set at a desired value.

Further, the composite impedance at the anti-resonance frequency occurring between those resonance frequencies is set to be equal to or less than a predetermined value. Thus, in the range from the band of the operating frequency of the semiconductor device 159 to the frequency band of the harmonic component, the composite impedance value can be made smaller over a wider frequency band. In particular, by setting the composite impedance value at the anti-resonance frequency to be 1 Ω or below, the inductance components included in the power source wiring layer and/or the ground wiring layer 154 to 156 can be decreased considerably. Thus, even in the high-frequency region where the semiconductor device 159 is operated at a frequency greater than several GHz, the simultaneous switching noise can be sufficiently reduced in an effective manner.

Also in this embodiment, by appropriately setting the resonance frequencies included in the impedance characteristics of a plurality of the built-in capacitors, the anti-resonance frequency can be set at a value incoincident with the operating frequency of the semiconductor device 159. This helps reduce the EMI noise more effectively.

By making such settings as described above, as large a capacitance value as possible can be secured, thereby achieving further reduction in the impedance value.

Note that, in this example, the insulating layer 152d is made larger in relative dielectric constant than the insulating layer 152c. However, even if the insulating layer 152c is made larger in relative dielectric constant than the insulating layer 152d, substantially the same effects are obtained.

In any of the first to seventh embodiments according to the invention, the multi-layer wiring board may be composed of a greater number of similarly-configured wiring layers stacked on top of each other.

While, in this description, with respect to the above-described multilayered wiring, the signal wiring takes on a micro-strip line structure in which a power source wiring layer and/or a ground wiring layer are formed so as to oppose the signal wiring, it may take on a combination of a strip line structure, in which a power source wiring layer and/or a ground wiring layer are formed above and below of the signal wiring, and a coplanar line structure in which a power source wiring layer and/or a ground wiring layer are formed contiguous to the signal wiring. That is, the signal wiring is constructed by appropriately selecting and combining the above-mentioned line structures in accordance with the specification of the multi-layer wiring board required.

Moreover, it is also possible to construct an electronic circuit module board by mounting thereon chip resistance, thin-film resistance, a coil inductor, a cross inductor, a chip capacitor, an electrolytic capacitor, and the like.

Further, the plane-wise configuration of each of the insulating layers may be of rhombus-, hexagonal-, or octagonal shape, instead of a square- or rectangular shape.

The multi-layer wiring board embodying the invention is used for an electronic component housing package such as a semiconductor device housing package, an electronic component mounting board, a so-called multi-chip module or multi-chip package for mounting thereon a multiplicity of semiconductor devices, or a mother board.

In the multi-layer wiring board embodying the invention, each of the insulating layers is formed in accordance with a ceramic green sheet stacking method, using an inorganic insulating material such as sintered aluminum oxide, sintered aluminum nitride, sintered silicon carbide, sintered silicon nitride, sintered mullite, or glass ceramics; an organic insulating material such as polyimide, epoxy resin, fluorine resin, polynol-bornane, or benzocyclobutene; or an electrically insulating material such as composite insulating material obtained by combining inorganic insulating material powder such as ceramic powder with thermosetting resin such as epoxy resin.

The following is an example of methods for forming the insulating layer. In a case of using sintered aluminum oxide, firstly, a suitable organic binder and solvent are mixedly added to powder of a starting material such as aluminum oxide, silicon oxide, calcium oxide, or magnesium oxide, to form a slurry. The slurry is then formed into ceramic green sheets in accordance with the conventionally-known doctor blade method. Subsequently, a conductor paste, prepared for constituting the signal wiring groups and the wiring conductor layers, is applied and printed thereon in a predetermined pattern, and the sheets are vertically stacked on top of each other. Lastly, the multilayered wiring thus obtained is fired in a reducing atmosphere at a temperature of approximately 1600° C.

On the other hand, in a case of using epoxy resin, the insulating layer is composed of ceramics made of sintered aluminum oxide, or glass epoxy resin which is obtained by impregnating a cloth impregnated with fiberglass with epoxy resin. The top surface of this insulating layer is clothed with an organic resin precursor by a coating technique based on a spin-coating method or a curtain coating method, and subsequently thermal-hardening treatment is conducted thereon, thereby forming the insulating layer made of organic resin such as epoxy resin. Meanwhile, a thin-film wiring conductor layer is formed from copper by the thin-film forming technique based on an electroless plating method or evaporation method using the photolithography. The insulating layer and the thin-film wiring conductor layer are alternately stacked in layers, and are then subjected to thermal-hardening treatment at a temperature of approximately 170° C.

The thickness of the insulating layer is appropriately set, in accordance with the properties of the materials in use, so as to satisfy the conditions for the mechanical strength and electric properties required for the specification.

Moreover, the following is an example of methods for obtaining insulating layers having different relative dielectric constants, for example, high dielectric constant layers. A high dielectric powder material, such as barium titanate, strontium titanate, calcium titanate, or magnesium titanate, is mixedly added to an inorganic insulating material such as aluminum oxide, aluminum nitride, silicon carbide, silicon nitride, mullite, or glass ceramics; or an organic insulating material such as polyimide, epoxy resin, fluorine resin, polynol-bornane, or benzocyclobutene. Then, the mixture is subjected to thermal-hardening treatment at a certain temperature. In this way, insulating layers of desired relative dielectric constants are fabricated.

Hereupon, the particle diameter of the high dielectric material, which is mixedly added to an inorganic or organic insulating material, should preferably fall within a range from 0.5 to 50 μm. By so doing, it is possible to suppress variation in relative dielectric constant between the insulating layers, which is caused by mixedly adding the high dielectric material to an inorganic or organic insulating material, and to suppress degradation of workability due to the change of the viscosity of the insulating layer.

Moreover, the content of the high dielectric material, which is mixedly added to an inorganic or organic insulating material, should preferably fall within a range from 5 to 75 wt %. By so doing, it is possible to secure as large a relative dielectric constant as possible in the insulating layer, and to prevent deterioration of the bonding strength between the inorganic or organic insulating material and the high dielectric material.

Further, the constituent elements such as the groups of parallel wiring layers, the wider-area power source wiring layer and/or ground wiring layer, and the group of through conductors can be composed of metal thin films. The examples of materials used therefor includes: metallization powder made of, for example, tungsten (W), molybdenum (Mo), molybdenum manganese (Mo—Mn), copper (Cu), silver (Ag), or silver palladium (Ag—Pd); and other metal materials such as copper (Cu), silver (Ag), nickel (Ni), chrome (Cr), titanium (Ti), gold (Au), niobium (Nb), or alloys of these metals.

More specifically, in a case of using metallization powder of (W), the groups of parallel wiring layers, the wider-area power source wiring layer and/or ground wiring layer, the group of through conductors, or others are formed as follows. Firstly, a suitable organic binder or solvent is mixedly added to the powder of (W) to form a metal paste. The metal paste is applied and printed on a ceramic green sheet, which is formed into insulating layers, in a predetermined pattern, and is then fired together with the multilayered wiring composed of the ceramic green sheets.

On the other hand, in a case of using a thin film made of a metal material, a metal film is formed by, for example, the sputtering method, the vacuum deposition method, or the plating method. Then, by using the photolithography, a predetermined wiring pattern is formed.

In the multi-layer wiring board described thus far, the signal wiring lines included in the groups of parallel wiring lines can be made identical with each other in characteristic impedance value by appropriately setting the wiring width of each of the groups of parallel wiring lines, in accordance with the relative dielectric constant of each of the insulating layer having the group of parallel wiring lines disposed thereon.

It should be noted that the invention is not limited to the embodiments described above, and therefore various changes and modifications of the invention are possible without departing from the spirit and scope of the claimed invention. For example, the invention may be applicable to a construction in which three or more groups of signal wiring lines are formed between different insulating layers. Moreover, the capacitors formed within the multi-layer wiring board may be three or more in number. Further, regarding the pattern configuration of the power source layer or the ground layer, it is possible to employ a so-called mesh pattern in which a multiplicity of openings are formed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A multi-layer wiring board comprising:
   an insulating substrate including a first insulating layer and a second insulating layer stacked on the first insulating layer, the insulating substrate having, on a central part of a top surface thereof, a semiconductor device mounting portion with a semiconductor device connecting electrode attached thereto, and having, on an under surface thereof, an external electrode for supplying electric power to the semiconductor device;
   a multilayered wiring including: a first group of parallel wiring lines formed on the first insulating layer, the parallel wiring lines, in each of divided sections that are obtained by dividing the multi-layer wiring board into several sections by two to four straight lines intersecting at a center of the first insulating layer in such a way that central angles of the divided sections are made substantially equal to each other, being so formed as to extend toward the intersection; a second group of parallel wiring lines formed on the second insulating layer, the parallel wiring lines, in each of the divided sections, being respectively arranged orthogonally with respect to the parallel wiring lines constituting the first group of parallel wiring lines; and a group of through conductors for providing electrical connection between the first and second groups of parallel wiring lines; and
   built-in capacitors provided in an interior of the insulating substrate, the built-in capacitors having a power source wiring layer and a ground wiring layer which are arranged to oppose each other via an insulating layer disposed therebetween,
   wherein electric power is supplied from the external electrode to the semiconductor device through the built-in capacitors,
   and wherein the built-in capacitors have mutually different resonance frequencies within a range from an operating frequency band for the semiconductor device to a frequency band for a harmonic component and are connected in parallel with each other, and at an anti-resonance frequency occurring between the different resonance frequencies, a composite impedance is set to be equal to or less than a predetermined value.

2. The multi-layer wiring board of claim 1,
   wherein the composite impedance value at the anti-resonance frequency is set to be 1 Ω or below.

3. The multi-layer wiring board of claim 1,
   wherein the first and second groups of parallel wiring lines each include a plurality of signal wiring lines and power source wiring lines or ground wiring lines arranged adjacent to the signal wiring lines.

4. The multi-layer wiring board of claim 1,
   wherein the second group of parallel wiring lines includes a circular wiring which is constituted by connecting the wiring lines lying in the individual divided sections.

5. The multi-layer wiring board of claim 4,
   wherein an outermost circular wiring of the second group of parallel wiring lines is a ground wiring.

6. The multi-layer wiring board of claim 1,
wherein the built-in capacitors are made different from each other in resonance frequency by varying sizes of the oppositely-arranged power source wiring layers and ground wiring layers of the built-in capacitors.

7. The multi-layer wiring board of claim 1,
wherein the built-in capacitors are made different from each other in resonance frequency by varying dielectric constants of the insulating layers lying between the oppositely-arranged power source wiring layers and ground wiring layers.

8. The multi-layer wiring board of claim 1,
wherein the built-in capacitors are so designed that the anti-resonance frequency a ssociated with the impedance characteristics is set at a value incoincident with the operating frequency of the semiconductor device.

9. The multi-layer wiring board of claim 1,
wherein, out of the built-in capacitors, the one arranged closer to the semiconductor device mounting portion is made higher in resonance frequency.

10. The multi-layer wiring board of claim 1,
wherein the power source wiring layers and the ground wiring layers, constituting the built-in capacitors, are formed on layers other than that on which the first and second groups of parallel wiring lines are formed.

11. A multi-layer wiring board comprising:
an insulating substrate constituted by stacking a plurality of insulating layers on top of each other, the insulating substrate having, on a top surface thereof, a semiconductor device connecting electrode, and having, on an under surface thereof, an external electrode for supplying electric power to the semiconductor device; and
built-in capacitors provided in an interior of the insulating substrate, the built-in capacitors having a power source wiring layer and a ground wiring layer which are arranged to oppose each other via the insulating layer disposed therebetween,
wherein electric power is supplied from the external electrode to the semiconductor device through the built-in capacitors,
and wherein the built-in capacitors have mutually different resonance frequencies within a range from an operating frequency band for the semiconductor device to a frequency band for a harmonic component, are connected in parallel with each other, and at an anti-resonance frequency occurring between the different resonance frequencies, a composite impedance is set to be equal to or less than a predetermined value.

12. The multi-layer wiring board of claim 11,
wherein the composite impedance value at the anti-resonance frequency is set to be 1 Ω or below.

13. The multi-layer wiring board of claim 11,
wherein the built-in capacitors are made different from each other in resonance frequency by varying sizes of the oppositely-arranged power source wiring layers and ground wiring layers of the built-in capacitors.

14. The multi-layer wiring board of claim 11,
wherein the built-in capacitors are made different from each other in resonance frequency by varying dielectric consants of the insulating layers lying between the oppositely-arranged power source wiring layers and ground wiring layers.

15. The multi-layer wiring board of claim 11,
wherein the built-in capacitors are so designed that the anti-resonance frequency associated with impedance characteristics is set at a value incoincident with the operating frequency of the semiconductor device.

* * * * *